US012740411B2

(12) United States Patent
Hsieh et al.

(10) Patent No.: US 12,740,411 B2
(45) Date of Patent: Sep. 15, 2026

(54) PACKAGE STRUCTURE INCLUDING A PACKAGE LID HAVING A PLURALITY OF FINS AND METHODS OF FORMING THE SAME

(71) Applicant: Taiwan Semiconductor Manufacturing Company Limited, Hsinchu (TW)

(72) Inventors: Ping-Yin Hsieh, Hsinchu City (TW); Chih-Hao Chen, Taipei City (TW); Li-Hui Cheng, New Taipei City (TW); Ying-Ching Shih, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 429 days.

(21) Appl. No.: 18/471,233

(22) Filed: Sep. 20, 2023

(65) Prior Publication Data

US 2025/0096062 A1 Mar. 20, 2025

(51) Int. Cl.

*H10W 40/22* (2026.01)
*H10W 40/70* (2026.01)

(Continued)

(52) U.S. Cl.

CPC ......... *H10W 40/226* (2026.01); *H10W 40/70* (2026.01); *H10W 72/071* (2026.01);

(Continued)

(58) Field of Classification Search

CPC . H01L 23/3672; H01L 21/4817; H01L 21/52; H01L 23/041; H01L 23/42;

(Continued)

(56) References Cited

U.S. PATENT DOCUMENTS

| | | | | |
|---|---|---|---|---|
| 10,153,218 B2 * | 12/2018 | Chen | H01L 23/3736 |
| 2015/0187679 A1 * | 7/2015 | Ho | H01L 23/34 438/118 |

(Continued)

FOREIGN PATENT DOCUMENTS

| | | |
|---|---|---|
| TW | 202125655 A | 7/2021 |
| TW | 202306065 A | 2/2023 |

(Continued)

OTHER PUBLICATIONS

Deppisch, Carl, et al. "The material optimization and reliability characterization of an indium-solder thermal interface material for CPU packaging." JOM, vol. 58, No. 6, Jun. 2006, pp. 67-74, https://doi.org/10.1007/s11837-006-0186-6. (Year: 2006).*

(Continued)

*Primary Examiner* — J. E. Schoenholtz

(74) *Attorney, Agent, or Firm* — The Marbury Law Group, PLLC

(57) ABSTRACT

A package structure includes a package substrate, an interposer module on the package substrate, a thermal interface material (TIM) layer on the interposer module, and a package lid on the TIM layer, including a package lid foot portion attached to the package substrate, a package lid plate portion connected to the package lid foot portion, and a plurality of fins extending from the package lid plate portion into the TIM layer over the interposer module.

20 Claims, 21 Drawing Sheets

(51) Int. Cl.
*H10W 72/00* (2026.01)
*H10W 72/30* (2026.01)
*H10W 76/01* (2026.01)
*H10W 76/12* (2026.01)
*H10W 90/00* (2026.01)

(52) U.S. Cl.
CPC ......... *H10W 76/01* (2026.01); *H10W 76/161* (2026.01); *H10W 72/352* (2026.01); *H10W 90/736* (2026.01)

(58) Field of Classification Search
CPC ..................... H01L 24/29; H01L 24/32; H01L 2224/29105; H01L 2224/29109; H01L 2224/29111; H01L 2224/29139; H01L 2224/32245; H01L 23/3675; H01L 23/3736
See application file for complete search history.

(56) References Cited

U.S. PATENT DOCUMENTS

| | | | | |
|---|---|---|---|---|
| 2018/0151472 | A1* | 5/2018 | Chen | H01L 23/367 |
| 2021/0249326 | A1* | 8/2021 | Uppal | H01L 24/32 |
| 2021/0407884 | A1* | 12/2021 | Eid | B33Y 70/00 |
| 2022/0367317 | A1* | 11/2022 | Hua | H01L 23/42 |
| 2023/0268317 | A1 | 8/2023 | Chen et al. | |
| 2023/0290704 | A1 | 9/2023 | Chen et al. | |

FOREIGN PATENT DOCUMENTS

| | | | |
|---|---|---|---|
| TW | 202320242 | A | 5/2023 |
| TW | 202336981 | A | 9/2023 |

OTHER PUBLICATIONS

Jianq Chyun Intellectual Property Office; TW Application No. 112144368; Office Action mailed Oct. 23, 2024; 18 pages.

* cited by examiner 100
130
130a
130f
130m
130p
140
141
142
110
110a
114
112
116
110b
160
190
161
127
129
200
114b
116a
110c
112a
116b
142
209
208
114a
207
206
128
205
204
141
155
203
140a
201
202
G
130f
170
151
119
121
120
161
190
221
S130p
130a x
y
z

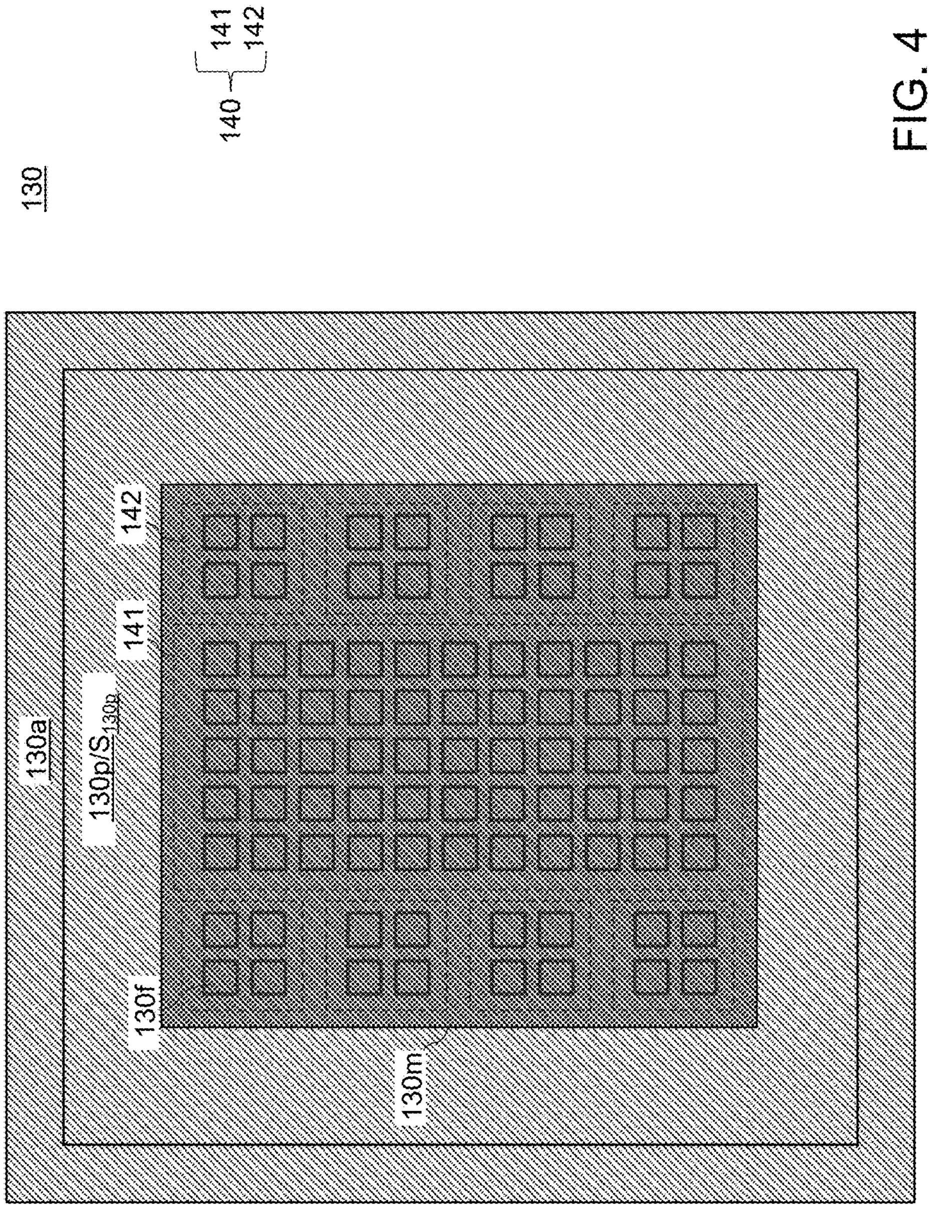
FIG. 4
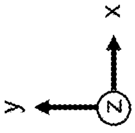

PACKAGE STRUCTURE INCLUDING A PACKAGE LID HAVING A PLURALITY OF FINS AND METHODS OF FORMING THE SAME

BACKGROUND

In electronic devices and other semiconductor components, heat may be generated during operation. Efficiently dissipating the generated heat may help to maintain the electronic devices' performance and prevent overheating, which may lead to performance degradation or even permanent damage.

A package structure (e.g., semiconductor packages) may sometimes include a thermal interface material (TIM) layer to help dissipate heat generated in the package structure. The TIM layer may enhance the transfer of heat between two surfaces with different thermal properties. The TIM layer may be located, for example, between an interposer module (e.g., package module) and a package lid (e.g., heat sink). The TIM layer may improve thermal contact by filling the microscopic gaps and irregularities between the interposer module and package lid.

The TIM layer may include one or more metal materials. The TIM layer may include, for example, a thermal grease or paste. The thermal grease may include, for example, a mixture of metal particles (e.g., silver, aluminum, or copper) suspended in a silicone or hydrocarbon-based grease. The TIM layer may include a thermal adhesive that includes metal particles mixed with an adhesive resin that cures after application. The TIM layer may include thermal pads including metal particles or metal foils or films including, for example, copper or aluminum. The TIM layer may also include a metal-infused graphite sheet.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates the package lid after the forming of the plating layer according to one or more embodiments.

DETAILED DESCRIPTION

Figure 1A:
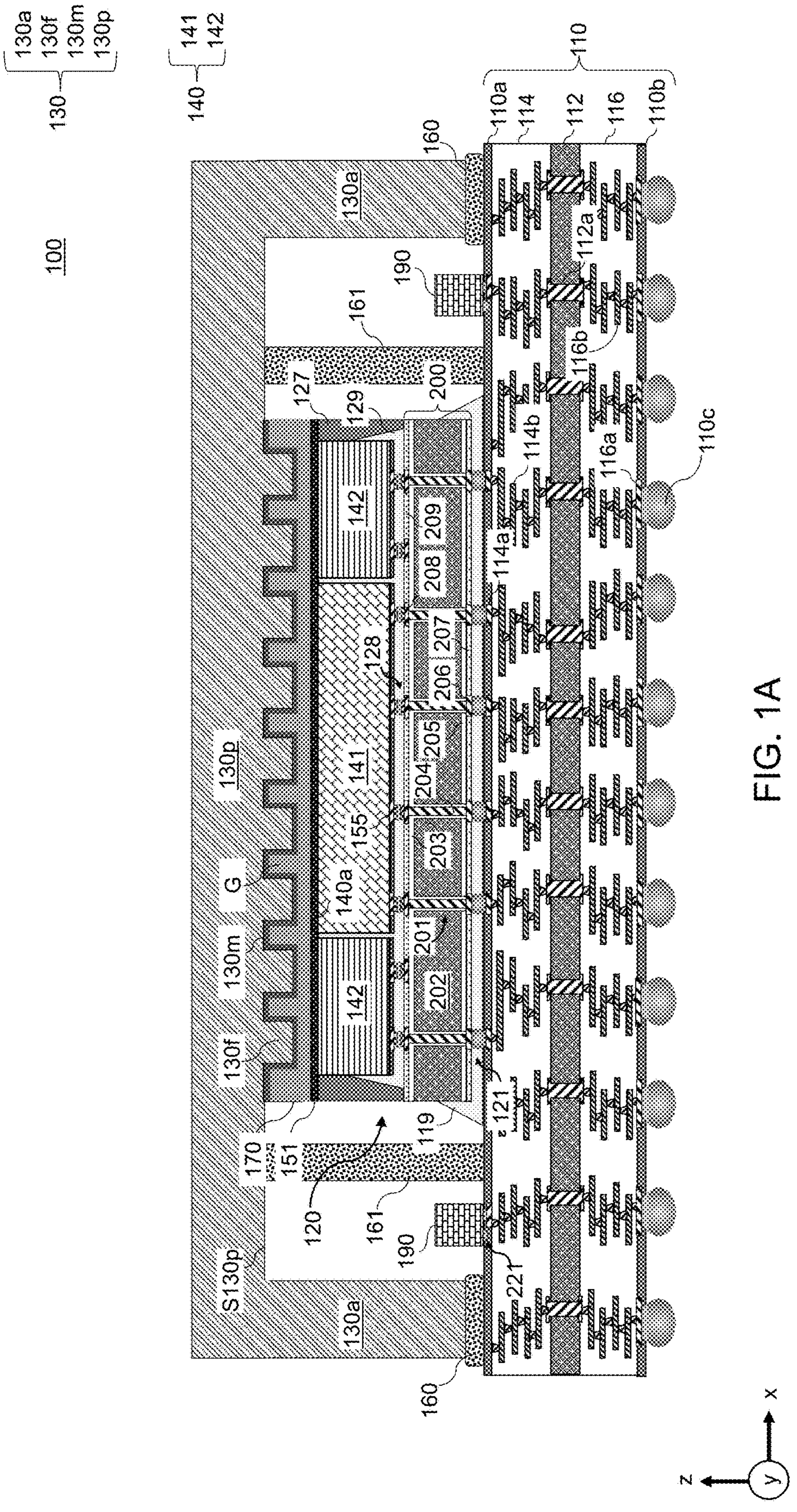
FIG. 1A is a vertical cross-sectional view of a package structure according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within the same thickness range.

In a related package structure the TIM layer may include, for example, a metal such as indium or gallium. In the related package structure, a coefficient of thermal expansion (CTE) mismatch between the package lid and package substrate may induce a high stress in the package structure. The stress may cause an inner crack to form within the TIM layer after a thermal cycle test is performed.

In one or more embodiments of the present disclosure, a package structure may include a package lid including a package lid plate portion and a plurality of fins extending from the package lid plate portion. The plurality of fins may form an innovative fin that acts as a heat spreader in the embodiment package structure. The plurality of fins may enhance a mechanical structure of the TIM layer (e.g., metal TIM layer). In one or more embodiments, the package lid may provide improved thermal dissipation performance in the package structure. The plurality of fins may greatly increase a bonding area to enhance the structural strength and inhibit formation of cracks in the TIM layer. In particular, an inner crack within the TIM layer (e.g., an indium TIM layer) may be suppressed by the plurality of fins of the package lid.

In at least one embodiment, the plurality of fins may constitute a "fin-like structure" formed above the interposer module (e.g., a chip-on-wafer region). In at least one embodiment, the TIM layer may include indium base material or gallium base material. In at least one embodiment, the TIM layer may include indium that may fill the gaps between the fins. The package lid may include a surface composition (from the inside to the outside) that includes copper, nickel and gold (or silver) or only copper and nickel. In at least one embodiment, the package lid may include a plating layer including nickel, gold, etc. on the plurality of fins.

The interposer module may include a backside metal (BSM) layer on an upper surface of the interposer module. The package structure may also include a first intermetallic compound (IMC) layer in a jointed interface of the TIM layer and the BSM layer (e.g., indium/BSM interface). The package structure may also include a second IMC layer in a jointed interface of the TIM layer and the package lid (e.g., indium/plating layer interface). A thickness of each of the first IMC layer and second IMC layer may be in a range from about 0.5 μm to about 2.0 μm (e.g., about 1.0 μm). Each of the first IMC layer and second IMC layer may include, for example, Au—In, Ni—In, Ni—Au—In, etc.

The interposer module may include one or more dies (e.g., semiconductor dies). A side surface on the dies (e.g., die side surface) may include one or more metal layers. The metal layers may include, for example, an adhesion layer, a diffusion barrier layer, and an anti-oxidation layer (e.g., a layer including gold).

Figure 1B:
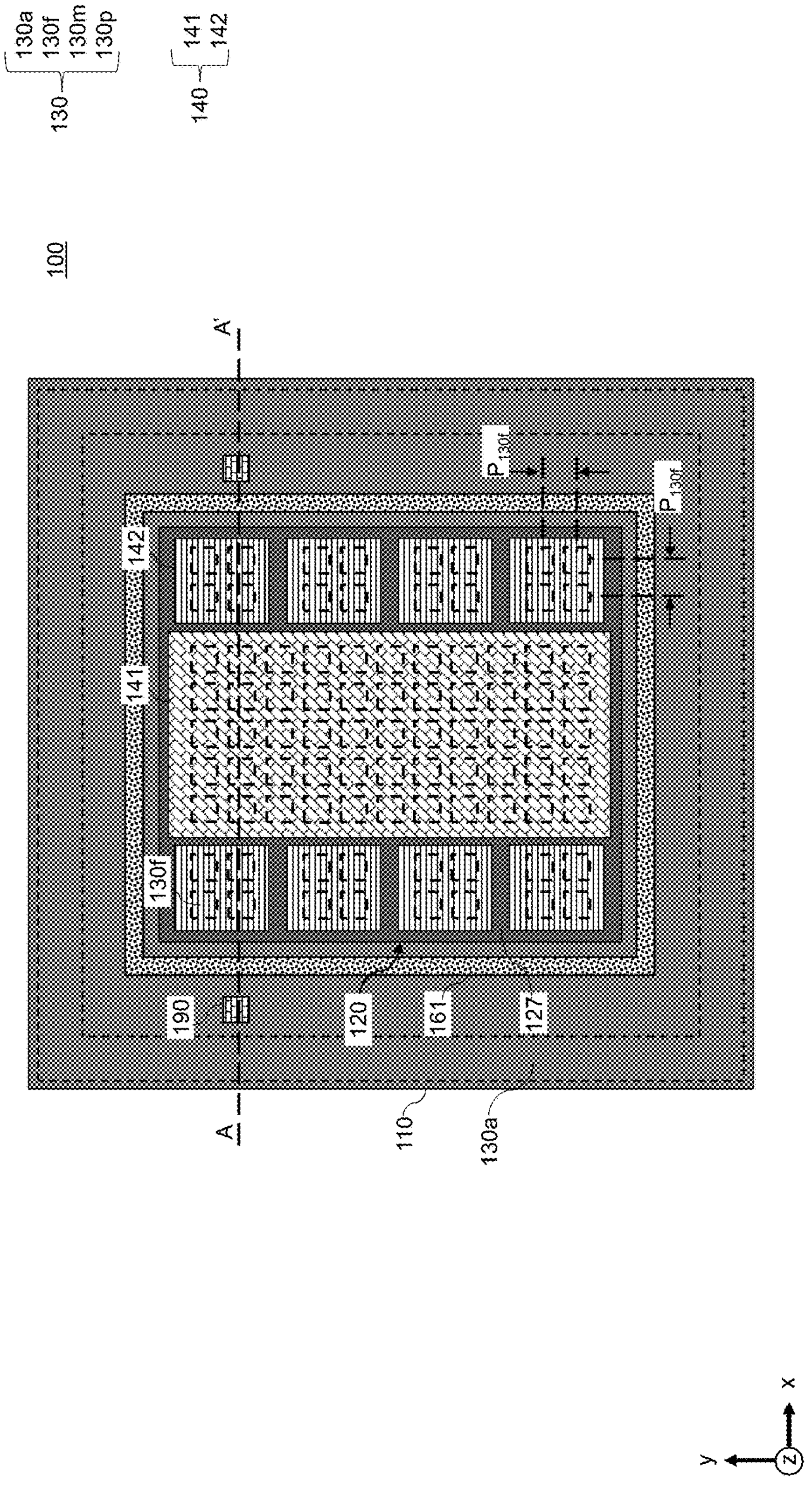
FIG. 1B is a plan view (e.g., top-down view) of the package structure according to one or more embodiments.
Figure 1C:
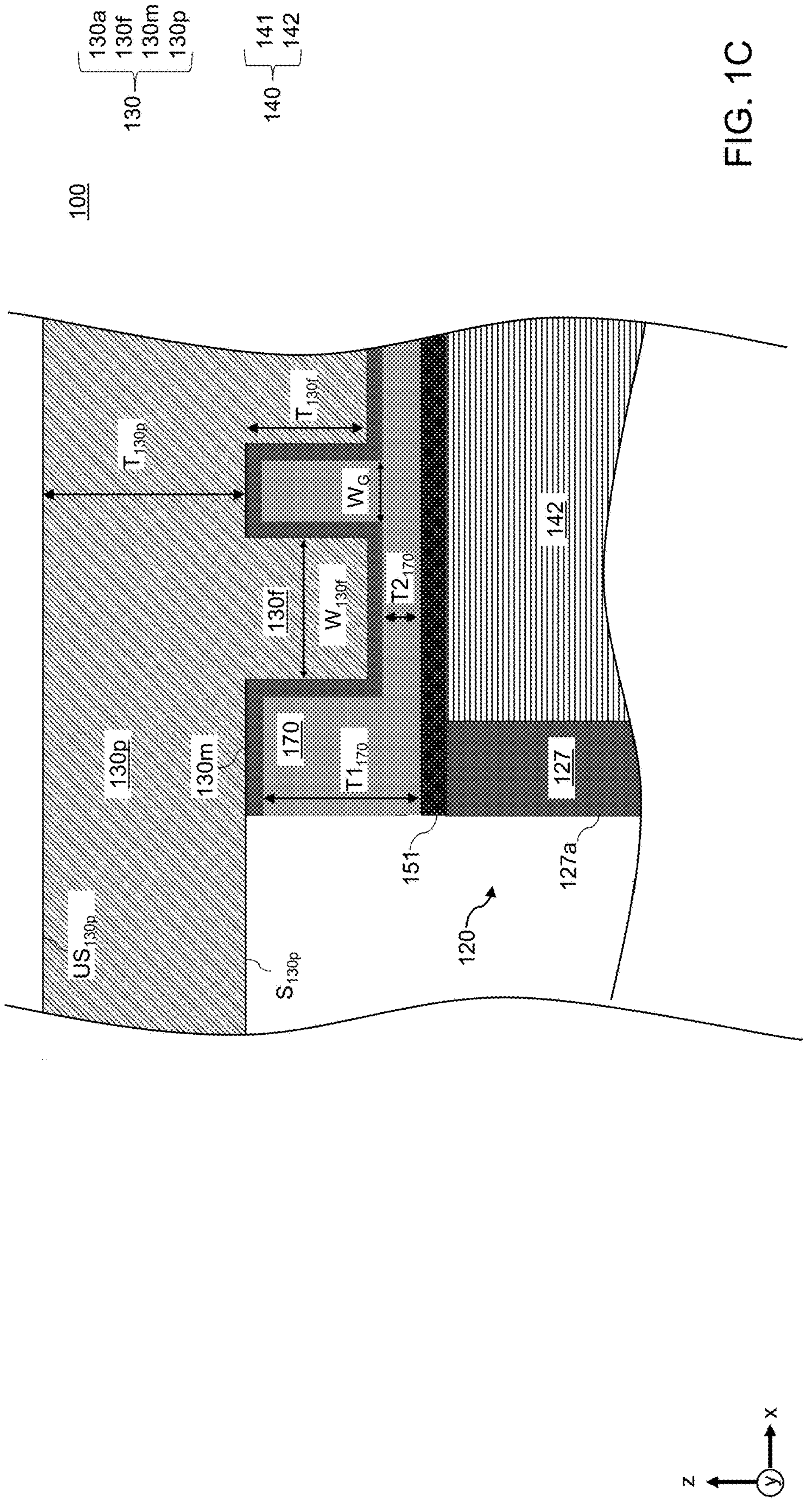
FIG. 1C is a detailed vertical cross-sectional view of a portion of the package lid in the package structure according to one or more embodiments.

FIG. 1A is a vertical cross-sectional view of a package structure 100 according to one or more embodiments. FIG. 1B is a plan view (e.g., top-down view) of the package structure 100 according to one or more embodiments. The vertical cross-sectional view in FIG. 1A is along the line A-A' in FIG. 1B. FIG. 1C is a detailed vertical cross-sectional view of a portion of the package lid 130 in the package structure 100 according to one or more embodiments.

As illustrated in FIG. 1A, the package structure 100 may include a package substrate 110, an interposer module 120 on the package substrate 110, and a thermal interface material (TIM) layer 170 on the interposer module 120. The package structure 100 may also include a package lid 130 on the TIM layer 170. The package lid 130 may include a package lid foot portion **130*a* attached to the package substrate 110. The package lid 130 may also include a package lid plate portion 130*p* connected to the package lid foot portion 130*a*. The package lid 130 may also include a plurality of fins 130*f* extending from the package lid plate portion 130*p* into the TIM layer 170 over the interposer module 120. The plurality of fins 130*f* may form an innovative fin heat spreader in the package structure 100. The plurality of fins 130*f* may enhance a mechanical structure of the TIM layer 170** (e.g., metal TIM layer).

The package substrate 110 may include a cored or coreless substrate. In at least one embodiment, for example, the package substrate 110 may include a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may help to provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclobutene (BCB) polymer, or polybenzobisoxazole (PBO). Other suitable dielectric materials are within the contemplated scope of disclosure.

The core 112 may include one or more through vias **112*a*. The through vias 112*a* may extend from a lower surface of the core 112 to an upper surface of the core 112. The through vias 112*a* may allow an electrical connection between the package substrate upper dielectric layer 114 and the package substrate lower dielectric layer 116. The through vias 112*a*** may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The package substrate upper dielectric layer 114 may be formed on an upper surface of the core 112. The package substrate upper dielectric layer 114 may include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114*a* on a chip-side surface of the package substrate upper dielectric layer 114. The package substrate upper bonding pads 114*a* may be exposed on the chip-side surface of the package substrate upper dielectric layer 114. The package substrate upper dielectric layer 114 may also include one or more metal interconnect structures 114*b*. The metal interconnect structures 114*b* may electrically couple the package substrate upper bonding pads 114*a* to the through vias 112*a* in the core 112. The metal interconnect structures 114*b* may include metal layers (e.g., copper traces) and metal vias connecting the metal layers. The package substrate upper bonding pads 114*a* and the metal interconnect structures 114*b* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A package substrate upper passivation layer 110*a* may be formed on the chip-side surface of the package substrate upper dielectric layer 114. The package substrate upper passivation layer 110*a* may at least partially cover the package substrate upper bonding pads 114*a*. The upper passivation layer 110*a* may include silicon oxide, silicon nitride, low-k dielectric materials such as carbon-doped oxides, extremely low-k dielectric materials such as porous carbon doped silicon dioxide, a combination thereof or other suitable material.

The package substrate lower dielectric layer 116 may be formed on a lower surface of the core 112. The package substrate lower dielectric layer 116 may also include a plurality of layers and, in particular, may include a build-up film (e.g., ABF). The package substrate lower dielectric layer 116 may also include an organic material such as a polymer material. In particular, the package substrate lower dielectric layer 116 may include a dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116*a* on a board-side surface of the package substrate lower dielectric layer 116. The package substrate lower dielectric layer 116 may also include one or more metal interconnect structures 116*b*. The metal interconnect structures 116*b* may electrically couple the package substrate lower bonding pads 116*a* to the through vias 112*a* in the core 112. The metal interconnect structures 116*b* may include metal layers (e.g., copper traces) and metal vias connecting the metal layers. The package substrate lower bonding pads 116*a* and the metal interconnect structures 116*b* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A package substrate lower passivation layer 110*b* may be formed on the board-side surface of the package substrate lower dielectric layer 116. The package substrate lower passivation layer 110*b* may at least partially cover the package substrate lower bonding pads 116*a*. The package substrate lower passivation layer 110*b* may include silicon oxide, silicon nitride, low-k dielectric materials such as carbon-doped oxides, extremely low-k dielectric materials such as porous carbon doped silicon dioxide, a combination thereof or other suitable material.

A ball-grid array (BGA) including a plurality of solder balls 110*c* may be formed on the board-side surface of the package substrate 110. The solder balls 110*c* may allow the package structure 100 to be securely mounted on a substrate such as a printed circuit board (PCB) and electrically coupled to the PCB substrate. The solder balls 110*c* may contact the package substrate lower bonding pads 116*a*, respectively. The solder balls 110*c* may therefore be electrically connected to the package substrate upper bonding pads 114*a* by way of metal interconnect structures 116*b*, the through vias 112*a* and the metal interconnect structures 114*b*. The solder balls 110*c* of the BGA may be formed in a two-dimensional array on the board-side surface of the package substrate 110. The solder balls 110*c* may be located, for example, under the package lid foot portion 130*a* and under the interposer module 120.

As illustrated in FIG. 1A, the package substrate 110 may have a width in the x-direction that is greater than a width of the interposer module 120 in the x-direction. The package substrate 110 may also have a length in the y-direction that is greater than a length of the interposer module 120 in the y-direction. The interposer module 120 may be located in a central portion of the package substrate 110. The interposer module 120 may include an interposer 200 and one or more dies 140 (e.g., semiconductor dies, top dies, etc.; see FIG. 1B) on the interposer 200. The interposer module 120 may be attached by C4 bumps 121 to the package substrate upper bonding pads 114*a* in the package substrate 110. The C4 bumps 121 may include a metal pillar (not shown) and a solder bump (e.g., SnAg solder bump) on the metal pillar. The solder bump may be collapsed to join the metal pillar of the C4 bump 121 to the package substrate upper bonding pads 114*a*.

A package underfill layer 119 may be formed on the package substrate 110 under and around the interposer module 120. The package underfill layer 119 may also be formed around the C4 bumps 121. The package underfill layer 119 may thereby securely fix the interposer module 120 to the package substrate 110. The package underfill layer 119 may be formed of an epoxy-based polymeric material.

The interposer module 120 is not limited to any particular configuration. The interposer module 120 may include, for example, a flip chip-chip scale package design, a chip-on-wafer-on-substrate design, an integrated fan-out design, and so on. In at least one embodiment, the interposer 200 may be omitted from the interposer module 120. In such embodiments, the dies 140 may be attached directly to the package substrate 110.

The interposer 200 of the interposer module 120 may include an inorganic interposer. The interposer 200 may include a semiconductor material layer 202. In at least one embodiment, the semiconductor material layer 202 may include a silicon-based semiconductor material. The semiconductor material layer 202 may include single crystalline silicon or polycrystalline silicon. The semiconductor material layer 202 may be undoped or doped with electrical dopants such as p-type dopants or n-type dopants.

The interposer 200 may include a plurality of via cavities 201 in the semiconductor material layer 202. The via cavities 201 may extend in the z-direction through an entire thickness of the semiconductor material layer 202. A lateral dimension (such as the diameter) of the via cavities 201 may be in a range from 0.5 micron to 10 microns, such as from 1 micron to 6 microns, although lesser and greater lateral dimensions may also be used. In at least one embodiment, the pattern of the array of via cavities 201 may have a two-dimensional periodicity over the interposer 200.

An insulating liner 203 may be formed in peripheral portions of the via cavities 201 and on an upper surface of the semiconductor material layer 202. The insulating liner 203 may include, for example, silicon oxide, silicon nitride, low-k dielectric materials such as carbon-doped oxides, extremely low-k dielectric materials such as porous carbon doped silicon dioxide, a combination thereof or other suitable material. The insulating liner 203 may have a thickness in a range from 1% to 20%, such as from 2% to 5% of the lateral dimension of the via cavities 201.

A plurality of through silicon vias (TSVs) 204 may be located in the plurality of via cavities 201, respectively. The TSVs 204 may include at least one conductive material, such as at least one metallic material, in a central portion of the via cavities 201. The TSVs 204 and the front insulating liner 203 may substantially fill the via cavities 201. The TSVs 204 may include, for example, a combination of a metallic barrier material (such as TiN, TaN, WN, MON, TiC, TaC, WC, etc.) and a metallic fill material (such as Cu, Co, Ru, Mo, W, etc.). Other suitable metallic barrier materials and metallic fill materials are within the contemplated scope of disclosure.

The interposer 200 may also include a lower insulating layer 205 on a bottom surface of the semiconductor material layer 202. The lower insulating layer 205 may join the insulating liner 203 in the via cavities 201. The lower insulating layer 205 may include a material that is the same or similar to the material of the insulating liner 203. The lower insulating layer 205 may include, for example, silicon oxide, silicon nitride, low-k dielectric materials such as carbon-doped oxides, extremely low-k dielectric materials such as porous carbon doped silicon dioxide, a combination thereof or other suitable material.

The interposer 200 may further include interposer lower bonding pads 206 on the TSVs 204 on a board-side surface of the interposer 200. The interposer 200 may further include a lower passivation layer 207 on the board-side surface of the interposer 200. The lower passivation layer 207 may at least partially cover the interposer lower bonding pads 206. The C4 bumps 121 may be connected to the interposer lower bonding pads 206 on the board-side surface of the interposer 200, respectively. In at least one embodiment, the C4 bumps 121 may include underbump metallurgy (UBM) layers on the interposer lower bonding pads 206. The C4 bumps 121 may be located at least partially on the lower insulating layer 205. The lower insulating layer 205 may serve to electrically insulate the C4 bumps 121 from the semiconductor material layer 202.

The interposer 200 may further include interposer upper bonding pads 208 on the TSVs 204 on a chip-side surface of the interposer 200. The interposer 200 may further include an upper passivation layer 209 on the board-side surface of the interposer 200. The upper passivation layer 209 may at least partially cover the upper interposer bonding pads 208. The interposer lower bonding pads 206 and interposer upper bonding pads 208 may be substantially similar to the package substrate lower bonding pads 116*a* and package substrate upper bonding pads 114*a*. The lower passivation layer 207 and upper passivation layer 209 may be substantially similar to the package substrate lower passivation layer 110*b* and package substrate upper passivation layer 110*a*.

In at least one embodiment, the interposer module 120 may include a redistribution layer (RDL) structure (not shown) located on the chip-side surface of the interposer 200. The RDL structure may include a plurality of polymer layers and a plurality of redistribution layers stacked alternately. The redistribution layers may include a metal such as copper, aluminum, nickel, titanium, a combination thereof or other suitable metals. The redistribution layers may include metallic connection structures, i.e., metallic structures that provide electrical connection between nodes in the structure. In at least one embodiment, the redistribution layers may include a plurality of traces (lines) and a plurality of vias connecting the plurality traces to each other. The traces may be respectively located on the polymer layers and may extend in the x-direction (first horizontal direction) and y-direction (second horizontal direction) on an upper surface of the polymer layers. The redistribution layers may interconnect the dies 140 and/or connect the dies 140 to the TSVs 204 in the interposer 200.

The dies 140 may be attached to the chip-side surface of the interposer 200 (or alternatively, to the RDL structure if present). In particular, the dies 140 may be flip-chip mounted on the upper surface of the interposer 200. That is, an active region of the dies 140 may face the interposer 200 and a bulk semiconductor region of the dies 140 may be opposite the active region. The dies 140 may include a substantially coplanar upper surface 140*a* (e.g., upper surface of the bulk semiconductor region). In particular, the upper surface 140*a* of the dies 140 may be located at a same height measured from an upper surface of the upper passivation layer 209.

In at least one embodiment, the dies 140 may be bonded to the upper interposer bonding pads 208 on the chip-side surface of the interposer 200 by microbumps 128. The microbumps 128 may each include a copper post and a solder bump on the copper post. In at least one embodiment, the dies 140 may include one or more die bonding pads 155 electrically coupled to an active region of the dies 140. The microbumps 128 may contact the die bonding pads 155 of the dies 140. The die bonding pads 155 may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

An interposer module underfill layer 129 may be formed (e.g., individually or collectively) under and around each of the dies 140. The interposer module underfill layer 129 may also be formed around the microbumps 128. The interposer module underfill layer 129 may thereby fix each of the dies 140 to the interposer 200. The interposer module underfill layer 129 may be formed of an epoxy-based polymeric material. Other suitable metal materials are within the contemplated scope of disclosure.

Instead of utilizing the microbumps 128 and interposer module underfill layer 129, the dies 140 may alternatively be bonded to the interposer 200 by a hybrid bond which may also be known as direct bonding or wafer-to-wafer bonding. The hybrid bond may include a metallic portion and a dielectric portion. In at least one embodiment, the hybrid bond may include a metal-metal bond and an oxide-oxide bond. In particular, the hybrid bond may include a bond between the die bonding pads 155 and the interposer upper bonding pads 209, and a bond between dielectric layers (e.g., oxide layers) on the dies 140 and dielectric layers (e.g., oxide layers) on the interposer 200.

The dies 140 may include a first die 141 and a second die 142 adjacent the first die 141. Each of the dies 140 may include, for example, a singular semiconductor die structure, a system-on-chip die, or a system-on-integrated chips die, and may be implemented by chip-on-wafer-on-substrate technology or integrated fan-out on substrate technology. In particular, each of the semiconductor dies 140 may include, for example, a semiconductor chip or chiplet for a high performance computing (HPC) application, an artificial intelligence (AI) application, and a 5G cellular network application, a logic die (e.g., mobile application processor, microcontroller, etc.), or a memory die (e.g., high-bandwidth memory (HBM) die, hybrid memory cube (HMC), dynamic random access memory (DRAM) die, a Wide I/O die, a M-RAM die, a R-RAM die, a NAND die, static random access memory (SRAM), etc.), a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., a co-processor, accelerator, an on-chip memory buffer, a high data rate transceiver die, a I/O interface die, an IPD die, a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a monolithic 3D heterogeneous chiplet stacking die, etc. Other dies are within the contemplated scope of this disclosure. In at least one embodiment, the first die 141 may include a primary die (e.g., system-on-chip die) and the second die 142 may include an ancillary die (e.g, DRAM die, HBM die, etc.) that supports an operation of the primary die.

A sidewall of the dies 140 (e.g., die sidewall) may include one or more metal layers (not shown). The metal layers may include, for example, an adhesion layer, a diffusion barrier layer, and an anti-oxidation layer (e.g., a layer including gold).

The interposer module 120 may also include a molding material layer 127 on the interposer 200, on and around the dies 140 and between the dies 140. The molding material layer 127 may be formed on (e.g., cover) and bonded to one or more of the die sidewalls (e.g., all of the die sidewalls) on the dies 140. In at least one embodiment, the dies 140 may be substantially "embedded" within the molding material layer 127. The molding material layer 127 may also be formed on and bonded to a surface of the upper passivation layer 209 of the interposer 200 (or the RDL structure, if present).

An upper surface of the molding material layer 127 may be substantially uniform (e.g., flat). The upper surface may also be substantially coplanar with the upper surface **140*a* of the dies 140. An outer sidewall of the molding material layer 127*a* may be substantially aligned with an outer sidewall of the interposer 200. In at least one embodiment, an outer sidewall of the interposer module 120 may be constituted at least in part by the outer sidewall of the molding material layer 127*a* and at least in part by the outer sidewall of the interposer 200**.

In at least one embodiment, the molding material layer 127 may be formed of a curable material that may cure to form a hard, solid structure. The molding material layer 127 may include, for example, epoxy molding compound (EMC). In at least one embodiment, the molding material layer 127 may include a polymeric material and in particular, an epoxy-based polymeric material. Other suitable molding materials may be used.

In at least one embodiment, the molding material layer 127 may have a CTE that is substantially similar to a CTE of the interposer 200. In at least one embodiment, the molding material layer 127 may include an added material (e.g., filler material) for improving a property of the molding material layer 127 (e.g., thermal conductivity, CTE, etc.). The added material may include, for example, metal powder, metal oxide powder, etc. Other materials in the molding material layer 127 are within the contemplated scope of the disclosure.

The interposer module 120 may also include an optional backside metal (BSM) layer 151 on the upper surface of the molding material layer 127 and/or on the upper surface **140*a* of the dies 140. The BSM layer 151 may be thermally conductive and improves a thermal dissipation characteristic of the interposer module 120. In at least one embodiment, the BSM layer 151 may cover an entire upper surface of the interposer module 120, including an entirety of the upper surface of the molding material layer 127 and/or an entirety of the upper surface 140*a* of the dies 140. In at least one embodiment, the BSM layer 151 may cover only a portion of the upper surface of the interposer module 120, including a portion of the upper surface of the molding material layer 127 and/or a portion of the upper surface 140*a* of the dies 140. This improved thermal dissipation may allow the interposer module 120 to further incorporate a lid structure to improve warpage characteristics. The BSM layer 151 may have a substantially uniform thickness. The BSM layer 151 may include a thermally conductive metal such as copper or a copper alloy. Other suitable materials may be included in the BSM layer 151**.

The TIM layer 170 may be located on the upper surface of the molding material layer 127 and/or on the upper surface **140*a* of the dies 140. The TIM layer 170 may alternatively or additionally be located on the optional BSM layer 151 if present. In at least one embodiment, a center of the TIM layer 170 may be substantially aligned with a center of the interposer module 120. In at least one embodiment, an outer sidewall of the TIM layer 170 may be substantially aligned with an outer sidewall of the interposer module 120 (e.g., an outer sidewall of the molding material layer 127. In at least one embodiment, the TIM layer 170 may be formed on an upper surface of the interposer module underfill layer 129 in a die-to-die gap between the dies 140**.

The TIM layer 170 may have a low bulk thermal impedance and high thermal conductivity. A thickness of the TIM layer 170 may be in a range from 50 μm to 300 μm. In at least one embodiment, a bond-line-thickness (BLT) (e.g., a distance between the package lid 130 and the interposer module 120) may be less than about 100 μm, although greater or lesser distances may be used. In at least one embodiment, the TIM layer 170 may cover an entire area of the upper surface of the interposer module 120. The TIM layer 170 may be attached to the upper surface of the interposer module 120 (and/or the optional BSM layer 151) by a thermally conductive adhesive. The TIM layer 170 may contact, for example, the upper surface **140*a* of the dies 140 and/or the upper surface of the molding material layer 127**.

In at least one embodiment, the TIM layer 170 may include one or more metals. The TIM layer 170 may include, for example, a low-melting-temperature (LMT) metal TIM or liquid metal TIM. The TIM layer 170 may include one or more metals such as indium or gallium (e.g., indium-rich TIM, gallium-rich TIM, etc.). The TIM layer 170 may include, for example, a gallium base, indium base, silver base, solder base, etc. The solder base may include tin and one or more other elements such as copper, silver, bismuth, indium, zinc, antimony, etc. Other metals in the TIM layer 170 are within the contemplated scope of this disclosure.

The TIM layer 170 may alternatively or additionally include a thermal grease, a thermal paste, thermal film, thermal adhesive, thermal gap filler, thermal pad (e.g., silicone), thermal tape or a gel-type TIM (e.g., a cross-linked polymer film). In at least one embodiment, the TIM layer 170 may include graphite, carbon nanotubes (CNTs), phase-change material (PCM), etc. The PCM may include, for example, a polymer based PCM. In at least one embodiment, the PCM may change its phase from solid to high-viscosity semi liquid around 60° C. Other materials in the TIM layer 170 are within the contemplated scope of this disclosure.

Referring again to FIG. 1A, the package structure 100 may optionally include one or more surface-mounted devices (SMDs) 190 on the package substrate 110. The SMDs 190 may be located between the interposer module 120 and the package lid foot portion 130*a*. The SMDs 190 may include, for example, a semiconductor die such as the dies 140 described above. In at least one embodiment, the SMDs 190 may include a memory die such as a DRAM die, HBM die, etc. The SMDs 190 may be electrically coupled to the interposer module 120 (and the dies 140 in the interposer module 120) through the package substrate 110. The SMDs 190 may also include non-functional dies (e.g., dummy dies) that may provide structural support to the package structure 100.

The SMDs 190 may be attached to the package substrate 110 by a plurality of C4 bumps 221. The C4 bumps 221 may have a structure and function substantially similar to the structure and function of the C4 bumps 121 described above. Similar to the C4 bumps 121, the C4 bumps 221 may be bonded the package substrate upper bonding pads 114*a*, respectively. The SMDs 190 may be electrically coupled to the package substrate 110 through the C4 bumps 221. Other suitable means of attaching the SMDs 190 to the package substrate 110 (e.g., adhesive) may be used.

An optional underfill layer (not shown) may be formed on the package substrate 110 under and around the SMDs 190 and around the C4 bumps 221. The optional underfill layer may help to securely fix the SMDs 190 to the package substrate 110. The optional underfill layer may be substantially the same as the package underfill layer 129 described above. In particular, the optional underfill layer may be formed of an epoxy-based polymeric material.

Referring again to FIG. 1A, the package lid 130 may be located on the TIM layer 170 and may provide a cover for the interposer module 120. The package lid 130 may also provide a cover for the SMDs 190. The package lid 130 may be formed, for example, of metal, ceramic or polymer material. Other suitable materials of the package lid 130 may be used.

The package lid foot portion 130*a* of the package lid 130 may be attached to the package substrate 110. The package lid foot portion 130*p* may extend in a substantially perpendicular direction from the package lid plate portion 130*p*. The package lid foot portion 130*p* may be connected to the package substrate 110 by an adhesive layer 160. The adhesive layer 160 may include, for example, epoxy adhesive or silicone adhesive. Other adhesives are within the contemplated scope of this disclosure.

The package structure 100 may also include an inner adhesive layer 161 on the package substrate 110 between the package lid foot portion 130*a*. The inner adhesive layer 161 may be located between the SMD 190 and the interposer module 120. The inner adhesive layer 161 may alternatively or additionally be located between the package lid foot portion 130*a* and the SMD 190. The inner adhesive layer 161 may extend from the package substrate 110 to the package lid plate portion 130*p*. The inner adhesive layer 161 may help to fix the package lid 130 to the package substrate 110. The inner adhesive layer 161 may include the same material as the adhesive layer 160 or a different material than the adhesive layer 160.

The package lid plate portion 130*p* (e.g., main body of the package lid 130) may be connected to the package lid foot portion 130*a* (e.g., an upper end of the package lid foot portion 130*a*). In at least one embodiment, the package lid plate portion 130*p* may be integrally formed as a unit with the package lid foot portion 130*a*. The package lid plate portion 130*p* may alternatively be formed separate from the package lid foot portion 130*a* and attached to the package lid foot portion 130*a* by an adhesive (not shown). The adhesive may be substantially similar to the adhesive layer 160 described above.

The package lid plate portion 130*p* may have a plate-shape extending, for example, in an x-y plane in FIG. 1A. An outer periphery of the package lid plate portion 130*p* may be substantially aligned with an outer periphery of the package lid foot portion 130*a*. The package lid plate portion 130*p* may be substantially parallel to an upper surface of the package substrate 110. The package lid plate portion 130*p* may include an inner region that is formed over a central portion of the interposer module 120. The inner region may contact at least a portion of the TIM layer 170 over the central portion of the interposer module 120. In at least one embodiment, a center of the inner region may be substantially aligned with the center of the interposer module 120 and/or with the center of the TIM layer 170.

The package lid plate portion 130*p* may include a bottom surface S130*p*. The bottom surface S130*p* may extend across an underside of the package lid plate portion 130*p*. In at least one embodiment, the bottom surface S130*p* may extend between the package lid foot portion 130*a* on one side of package structure 100 to the package lid foot portion 130*a* on the opposite side of the package structure 100. In at least one embodiment, the bottom surface S130*p* may constitute substantially the entire underside of the package lid plate portion 130*p*. The bottom surface S130*p* of the package lid plate portion 130*p* may contact the TIM layer 170. In one or more embodiments, the bottom surface S130*p* may directly contact an entirety of the upper surface of the TIM layer 170. In one or more embodiments, the TIM layer 170 may be compressed between the bottom surface S130*p* of the package lid plate portion 130*p* and the upper surface of the interposer module 120.

As illustrated in FIG. 1A, the plurality of fins 130*f* may extend from the bottom surface S130*p* of the package lid plate portion into the TIM layer 170 over the interposer module 120. The plurality of fins 130*f* may enhance the dissipation of heat in the package structure 100 while also enhancing a mechanical structure of the TIM layer 170. The fins 130*f* may be separated, for example, by a gap G and at least a portion of the TIM layer 170 may be located in the gap G. In at least one embodiment, each of the fins 130*f* are located over the interposer module 120. In at least one embodiment, each of the fins 130*f* are located over the dies 140 in the interposer module 120. In at least one embodiment, each of the fins 130*f* extend to some extent into the TIM layer 170.

Referring again to FIG. 1B, the package lid 130 and the TIM layer 170 are omitted from the top-down view of the package structure 100 in FIG. 1B for ease of understanding. A location of the package lid foot portion 130*a* and a location of the fins 130*f* are indicated by dotted lines in FIG. 1B. As illustrated in FIG. 1B, the package lid foot portion 130*a* (and thus, the package lid plate portion 130*p* (not shown)) may have an outer shape that is substantially the same as an outer shape of the package substrate 110. Further, the interposer module 120 may be arranged in a central portion of the package substrate 110 and the SMDs 190 may be arranged around the interposer module 120.

Although FIG. 1B illustrates the package structure 100 as including one (1) first die 141 and eight (8) second dies 142 having a particular arrangement, the number and arrangement of the first dies 141 and second dies 142 are not limited to the number and arrangement in FIG. 1B. Although FIG. 1B illustrates the package structure 100 as including two (2) SMDs 190 having a particular arrangement, the number of SMDs 190 and the arrangement of the SMDs 190 are not limited to the number and arrangement in FIG. 1B.

The package substrate 110 may have a substantially rectangular shape or alternatively a substantially square shape. Other shapes of the package substrate 110 are within the contemplated scope disclosure. In at least one embodiment, the package substrate 110 may have a package substrate width in the x-direction and a package substrate length greater than the package substrate width in the y-direction. The package lid foot portion 130*a* (e.g., and the package lid plate portion 130*p*) may have a width and length substantially similar (e.g., slightly less) that the package substrate width and package substrate length, respectively. The package lid foot portion 130*a* may be formed around an entire periphery of the interposer module 120. The package lid foot portion 130*a* may alternatively be formed around only a portion of the interposer module 120.

The interposer module 120 may have an interposer module width in the x-direction and an interposer module length greater than the interposer module width in the y-direction. The interposer module 120 may have a substantially rectangular shape or alternatively a substantially square shape. Other shapes of the interposer module 120 are within the contemplated scope disclosure. The dies 140 may have a substantially rectangular shape or alternatively a substantially square shape. Other shapes of the dies 140 are within the contemplated scope disclosure. The dies 140 may have a die width in the x-direction and a die length greater than the die width in the y-direction. Although the interposer module 120 is illustrated in FIG. 1B as including two dies 140 having a particular arrangement, the number of dies 140 and the arrangement of the dies 140 is not limited to the number and arrangement in FIG. 1B.

As illustrated in FIG. 1B, the inner adhesive layer 161 may be formed around the entire periphery of the interposer module 120. The inner adhesive layer 161 may alternatively be formed only around a portion of the interposer module 120. For example, the inner adhesive layer 161 may be formed only at the corners of the interposer module 120. The fins 130*f* of the package lid 130 may extend in the form of a cylinder from the bottom surface $S_{130p}$ of the package lid plate portion. The fins 130*f* may be formed as a square cylinder in which case the fins 130*f* may have a square-shaped cross-section. A square-shaped end portion of the fins 130*f* may be embedded in the TIM layer 170. The fins 130*f* may alternatively be formed as a circular cylinder in which case the fins 130*f* may have a circular-shaped cross-section. Other shapes of the fins 130*f* are within the contemplated scope of disclosure. For example, oval-shaped cross section, triangular-shaped cross section as well as other polygon-shaped cross sections may be used.

The fins 130*f* of the package lid 130 may have a pitch $P_{130f}$ (e.g., distance between centers) in both the x-direction and in the y-direction. The fins 130*f* of the package lid 130 may alternatively have a pitch in the x-direction different from the pitch in the y-direction. In at least one embodiment, the pitch $P_{130f}$ may be in a range from 1 mm to 5 mm. The pitch $P_{130f}$ may be substantially uniform throughout the entirety of the fins 130*f*. The pitch $P_{130f}$ may alternatively vary among the fins 130*f* in the x-direction and/or y-direction. Put another way, the pitch $P_{130f}$ in the x-direction may be the same or different than the pitch $P_{130f}$ in the y-direction.

The fins 130*f* of the package lid 130 may be formed over the dies 140 in the interposer module 120. In at least one embodiment, a position of the fins 130*f* may correspond to a semiconductor (e.g., silicon) region of the interposer module 120 (e.g., a die region, system on chip region, HBM region, etc.). In at least one embodiment, one or more of the fins 130*f* may include at least a portion over the molding material layer 127 in the interposer module 120. In at least one embodiment, the fins 130*f* may be formed in an array of rows and columns on the first die 141. The fins 130*f* may also be formed in an array of rows and columns on the second dies 142. In at least one embodiment, a row of fins 130*f* on the first die 141 may be substantially aligned in the x-direction with a row of fins 130*f* on the second dies 142.

Referring again to FIG. 1C, the TIM layer 170 may have a first thickness T1170 between the bottom surface S130*p* and the interposer module 120 or as optionally shown in FIG. 1C, between an optional BSM layer 151 and an optional plating layer 130*m*. A thickness of the plating layer 130*m* may be substantially equal to a thickness of the BSM layer 151. The plating layer 130*m* may include a thermally conductive metal such as copper or a copper alloy. Other suitable thermally conductive metal materials for use in the plating layer 130*m* are within the contemplated scope of disclosure The TIM layer 170 may also have a second thickness $T2_{170}$ between the fins 130*f* and the interposer module 120 (e.g., between the optional BSM layer 151 and the optional plating layer 130*m*). The first thickness $T1_{170}$ may be greater than the second thickness $T2_{170}$. In at least one embodiment, first thickness $T1_{170}$ may be at least twice the second thickness $T2_{170}$. In at least one embodiment, the first thickness $T1_{170}$ may be in a range from 200 μm to 400 μm. In at least one embodiment, the second thickness $T2_{170}$ in a range from 20 μm to 80 μm.

The package lid plate portion 130*p* may have a thickness $T_{130p}$ between an upper surface $US_{130p}$ of the package lid plate portion 130*p* and the bottom surface $S_{130p}$ of the package lid plate portion 130*p*. The fins 130*f* may have a thickness $T_{130f}$ (e.g., depth as measured from the bottom surface $S_{130p}$ of the package lid plate portion 130*p* to the top surface of the optional plating layer 130*m* or the top surface of the TIM layer 170. That is, the fins 130*f* may extend into the TIM layer 170 by length equal to the thickness $T_{130f}$. In at least one embodiment, the thickness $T_{130f}$ may be equal to or less than the thickness $T_{130p}$. In at least one embodiment, the thickness $T_{130f}$ may be in a range from 25% to 75% of the thickness $T_{130p}$. In at least one embodiment, the thickness $T_{130f}$ may be in a range from 25 μm to 100 μm.

The fins 130*f* may have a width $W_{130f}$ in a range from 100 μm to 1000 μm. In at least one embodiment, the width $W_{130f}$ of the fins 130*f* may be greater than a thickness of the fins 130*f*. In at least one embodiment, the width $W_{130f}$ of the fins 130*f* may be uniform over the entirety of the fins 130*f*. In at least one embodiment, the width $W_{130f}$ of the fins 130*f* may vary in the x-direction and/or y-direction.

The fins 130*f* may be separated in the x-direction and the y-direction (see FIG. 1B) by a gap G. In at least one embodiment, the width $W_G$ of the gap G may be less than the width $W_{130f}$ of the fins 130*f*. The width $W_G$ of the gap G may alternatively be equal to or greater than the width $W_{130f}$ of the fins 130*f*. In at least one embodiment, the width $W_G$ may be uniform over the entirety of the gaps G. In at least one embodiment, the width $W_G$ of the gaps G may vary in the x-direction and/or y-direction. In at least one embodiment, the width $W_G$ of the gap G may be in a range from 50 μm to 2000 μm.

Figure 2B:
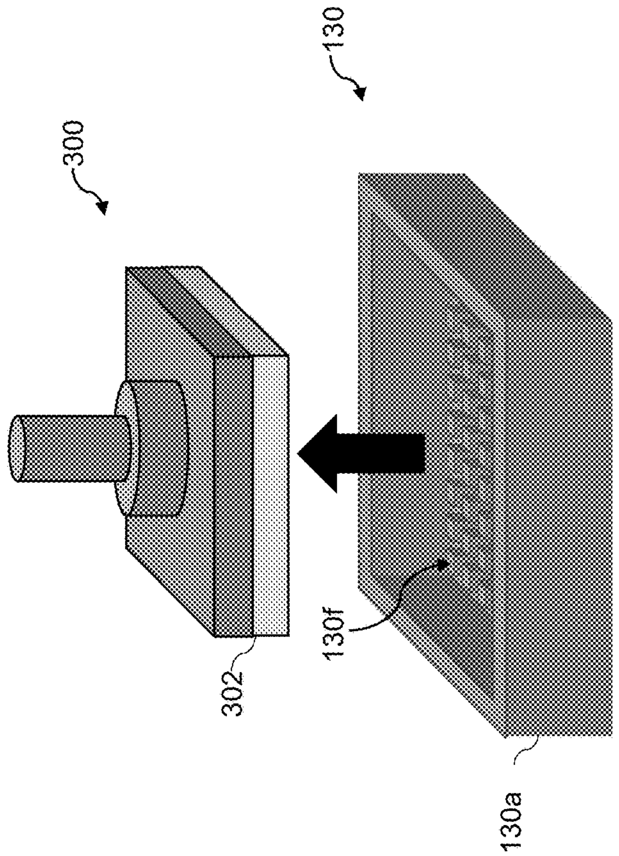
FIG. 2B illustrates a stamp being retracted away from the bottom surface after the forming of the fins according to one or more embodiments.
Figure 2A:
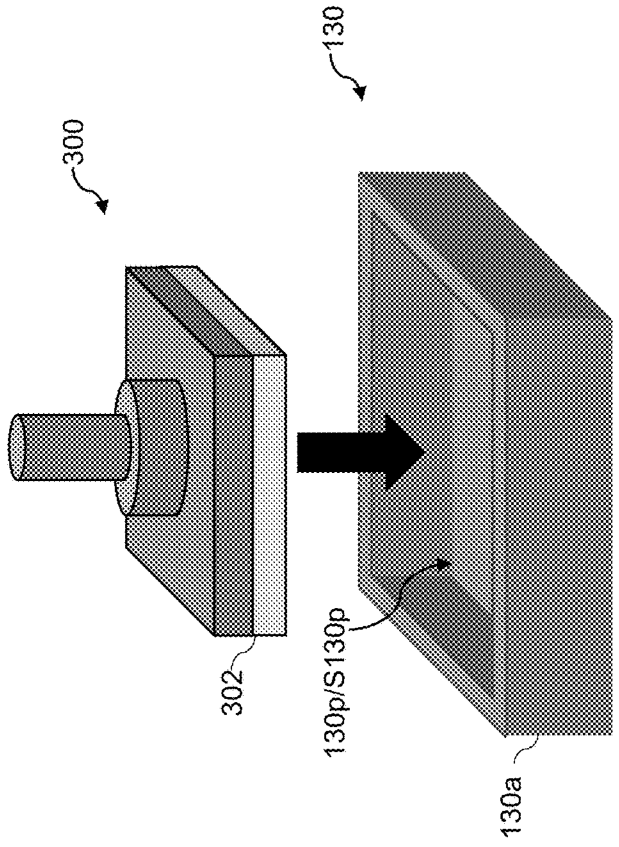
FIG. 2A illustrates a stamp being forced onto the bottom surface of the package lid plate portion according to one or more embodiments.

FIG. 2A to FIG. 4 illustrate various intermediate structures in a method of forming the package lid 130 according to one or more embodiments. FIGS. 2A-2B illustrate a stamping process of forming the fins 130*f* of the package lid 130 according to one or more embodiments.

FIG. 2A illustrates a stamp 300 being forced onto the bottom surface S130*p* of the package lid plate portion 130 according to one or more embodiments. After the package lid foot portion 130*a* is formed, for example, by milling using a computer numerical control (CNC) milling machine, or by molding or stamping, the fins 130*f* may be formed on bottom surface S130*p* of the package lid plate portion 130*p* by a stamping process. The fins 130*f* may alternatively be formed prior to forming the package lid foot portion 130*a*.

The fins 130*f* may also be formed by other suitable methods such as an etching process. In the etching process, for example, a patterned photoresist mask may be formed on the bottom surface S130*p* of the package lid plate portion 130*p*. The photoresist mask may include openings having a location other than where the fins 130*f* are to be formed on the bottom surface S130*p*. An etching process may then be performed through openings in the photoresist mask in order to etch the bottom surface S130*p* everywhere except for where the fins 130*f* are to be located.

As illustrated in FIG. 2A, the stamp 300 used in the stamping process may include a recess pad 302 formed on a bottom of the stamp 300. The recess pad 302 may include a plurality of recesses 302*a* (see FIGS. 3A-3E) that may transfer a pattern of the fins 130*f* onto the bottom surface S130*p* of the package lid plate portion 130*p*. The recesses 302*a* may include openings that extend through an entire thickness of the recess pad 302. The recesses 302*a* may have a substantially square shape that corresponds to a cross-sectional shape of the fins 130*f*.

In the stamping process, the package lid 130 may be inverted and placed on a rigid structure having a flat surface such as a table-top. The stamp 300 may then be located over the bottom surface S130*p* of the package lid plate portion 130*p*, and lowered into the package lid 130 so that the recess pad 302 contacts the bottom surface S130*p* of the package lid plate portion 130*p*. The stamp 300 may then be forced downwardly with a pressing force so that the recess pad 302 is pressed into the bottom surface S130*p* of the package lid plate portion 130*p*. The pressing force may be applied with sufficient magnitude and duration so as to force the lid material (e.g., copper) of the package lid 130 into the recesses 302*a* thereby forming the fins 130*f* in the recesses 302*a*. The thickness of the fins 130*f* (see FIG. 1B) may be proportional to the magnitude and duration of the applied pressing force.

FIG. 2B illustrates a stamp 300 being retracted away from the bottom surface S130*p* after the forming of the fins 130*f* according to one or more embodiments. As the stamp 300 is retracted, the lid material may be pulled out of the recesses 302*a*, leaving the fins 130*f* on the bottom surface $S_{130p}$ of the package lid plate portion 130*p*.

Figure 3A:
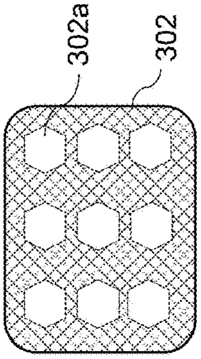
FIGS. 3A-3E illustrate various protrusion pads that may be used in the stamping process according to one or more embodiments.
Figure 3B:
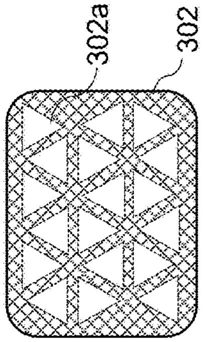
Figure 3C:
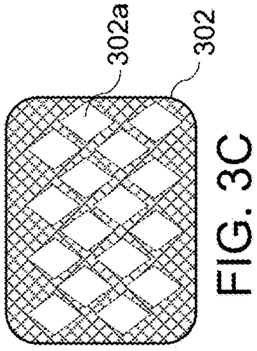
Figure 3D:
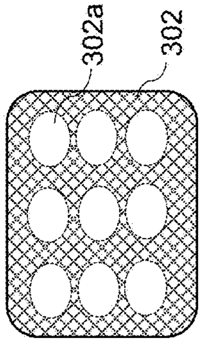
Figure 3E:
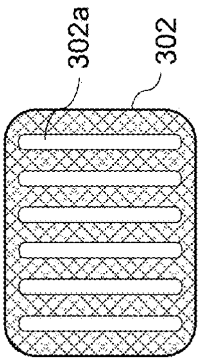

FIGS. 3A-3E illustrate various recess pads 302 that may be used in the stamping process according to one or more embodiments. As illustrated in FIGS. 3A-3E, the recess pad 302 may include hexagonal-shaped recesses 302*a* (FIG. 3A), triangular-shaped recesses 302*a* (FIG. 3B), diamond-shaped recesses 302*a* (FIG. 3C), oval-shaped recesses 302*a* (FIG. 3D), and line-shaped recesses 302*a* (FIG. 3E). Other shapes of the recesses 302*a* are within the contemplated scope of disclosure. In some embodiments, the shape of the recesses (and thus, the resulting fins 130*f*) may be substantially uniform. In some embodiments, the shape of the recesses (and thus, the resulting fins 130*f*) may vary. In at least one embodiment, the recess pad 302 may be removably fixed to the bottom of the stamp 300 to allow the convenient replacement of the recess pad 302 with a different recess pad 302 having a different design.

FIG. 4 illustrates the package lid 130 after the forming of the plating layer 130*m* according to one or more embodiments. After the fins 130*f* have been formed on the bottom surface S130*p* of the package lid plate portion 130*p*, the optional plating layer 130*m* may be formed on the fins 130*f*. The optional plating layer 130*m* may be formed to cover an area corresponding substantially to an area of the interposer module 120 (e.g., an area of the TIM layer 170 on the interposer module 120). That is, an outline of the optional plating layer 130*m* in the plan view (e.g., looking down onto the bottom surface S130*p*) may be formed to match an outline of the interposer module 120. The optional plating layer 130*m* may be formed by an electroplating process. Other methods of forming the optional plating layer 130*m* are within the contemplated scope of disclosure.

Figure 5A:
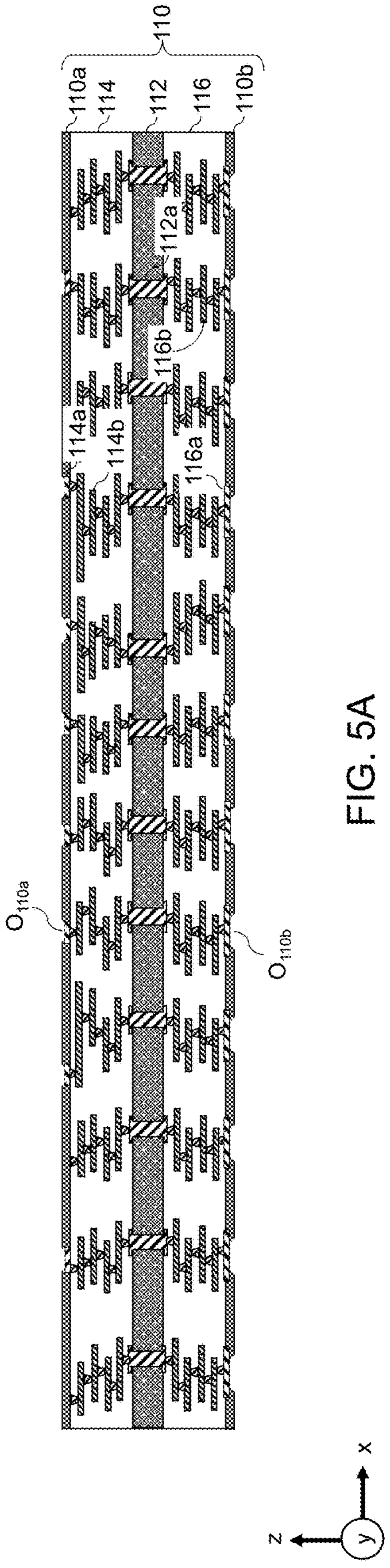
FIG. 5A is a vertical cross-sectional view of an intermediate structure including the package substrate having package substrate upper bonding pads and package substrate lower bonding pads, according to one or more embodiments.

FIGS. 5A-5J illustrate various intermediate structures in a method of forming the package structure 100 according to one or more embodiments. FIG. 5A is a vertical cross-sectional view of an intermediate structure including the package substrate 110 having package substrate upper bonding pads 114*a* and package substrate lower bonding pads 116*a*, according to one or more embodiments. The package substrate 110 including the core 112, the package substrate upper dielectric layer 114, and the package substrate lower dielectric layer 116 may be provided.

The package substrate upper bonding pads 114*a* may be formed, for example, on an uppermost dielectric layer of the package substrate upper dielectric layer 114. The package substrate upper bonding pads 114*a* may be formed to contact the metal interconnect structures 114*b*. The package substrate upper bonding pads 114*a* may be formed by depositing a metal layer (e.g., copper, aluminum, or other suitable conductive materials) on the upper surface of the package substrate upper dielectric layer 114. The metal layer may then be patterned by etching (e.g., by wet etching, dry etching, etc.) to form the package substrate upper bonding pads 114*a*. Other suitable metal layer materials and etching processes may be within the contemplated scope of disclosure.

The package substrate lower bonding pads 116*a* may be formed, for example, on a lowest dielectric layer of the package substrate lower dielectric layer 116. The package substrate lower bonding pads 116*a* may be formed to contact the metal interconnect structures 116*b*. The package substrate lower bonding pads 116*a* may be formed in a manner similar to the manner of forming the package substrate upper bonding pads 114*a* (e.g., depositing a metal layer, patterning the metal layer by etching, etc.).

After formation, the package substrate upper bonding pads 114*a* and package substrate lower bonding pads 116*a* may optionally undergo a surface roughening treatment (e.g., copper zarazara (CZ) treatment). In the surface roughening treatment, a surface of the package substrate upper bonding pads 114*a* (e.g., a copper surface) and surface of the package substrate lower bonding pads 116*a* (e.g., a copper surface) may be etched by an organic acid-type microetching solution, to create a super-roughened surface (e.g., copper surface). The uniquely-roughened copper surface topography of the package substrate upper bonding pads 114*a* and package substrate lower bonding pads 116*a* may help to achieve a high copper-to-resin adhesion.

The package substrate upper passivation layer 110*a* and package substrate lower passivation layer 110*b* may then be formed on the package substrate upper bonding pads 114*a* and package substrate lower bonding pads 116*a*, respectively. In at least one embodiment, the package substrate upper passivation layer 110*a* and package substrate lower passivation layer 110*b* may each include a solder resist layer (e.g., polymer material), also referred to as a solder mask. The package substrate upper passivation layer 110*a* may also be referred to as the upper solder resist layer 110*a*, and the package substrate lower passivation layer 110*b* may also be referred to as the lower solder resist layer 110*b*.

The package substrate upper passivation layer 110*a* and package substrate lower passivation layer 110*b* may be applied concurrently. The package substrate upper passivation layer 110*a* and package substrate lower passivation layer 110*b* may be applied, for example, as a liquid photo-imagable film. The liquid photo-imagable film can be applied, for example, by silk-screening or spraying the liquid photo-imagable film onto the surface of the package substrate 110. The liquid photo-imagable film may be applied over the package substrate upper bonding pads 114*a* and the package substrate lower bonding pads 116*a*. The package substrate upper passivation layer 110*a* and package substrate lower passivation layer 110*b* may alternatively be applied as a dry-film photo-imagable film that may be vacuum-laminated onto the surface of the package substrate 110 and over the package substrate upper bonding pads 114*a* and package substrate lower bonding pads 116*a*, respectively. The package substrate upper passivation layer 110*a* and package substrate lower passivation layer 110*b* may alternatively or additionally be formed, for example, by chemical vapor deposition (CVD), physical vapor deposition (PVD), spin coating, lamination, or other suitable deposition technique.

The package substrate upper passivation layer 110*a* and package substrate lower passivation layer 110*b* may be applied to have a thickness that is slightly greater than a thickness of the package substrate upper bonding pads 114*a* and package substrate lower bonding pads 116*a*, respectively. Alternatively, the package substrate upper passivation layer 110*a* and package substrate lower passivation layer 110*b* may be applied so as to have an upper surface that is substantially coplanar with an upper surface of the package substrate upper bonding pads 114*a* and package substrate lower bonding pads 116*a*, respectively.

Openings $O_{110a}$ may then be formed in the package substrate upper passivation layer 110*a* so as to expose the upper surface of the package substrate upper bonding pads 114*a*. Openings $O_{110b}$ may be formed in the package substrate lower passivation layer 110*b* to expose an upper surface of the package substrate lower bonding pads 116*a*. The openings $O_{110a}$ and the openings $O_{110b}$ may be formed, for example, by using a photolithographic process. In at least one embodiment, the openings $O_{110a}$ and the openings $O_{110b}$ may be formed in separate photolithographic processes.

The photolithographic process (e.g., processes) used to form the openings $O_{110a}$ may include forming a patterned photoresist mask (not shown) on the package substrate upper passivation layer 110*a*, and etching (e.g., wet etching, dry etching, etc.) the exposed upper surface of the package substrate upper passivation layer 110*a* through openings in the photoresist mask. The photoresist mask may be subsequently removed by ashing, dissolving the photoresist mask or by consuming the photoresist mask during the etch process.

The photolithographic process (e.g., processes) used to form the openings $O_{110b}$ may include forming a patterned photoresist mask (not shown) on the package substrate lower passivation layer 110*b*, and etching (e.g., wet etching, dry etching, etc.) the exposed upper surface of the package substrate lower passivation layer 110*b* through openings in the photoresist mask. The photoresist mask may be subsequently removed by ashing, dissolving the photoresist mask or by consuming the photoresist mask during the etch process.

After the openings $O_{110a}$ are formed in the package substrate upper passivation layer 110*a* and the openings $O_{110b}$ are formed in the package substrate lower passivation layer 110*b*, the package substrate upper passivation layer 110*a* (upper solder resist layer) and the package substrate lower passivation layer 110*b* (lower solder resist layer) may be cured such as by a thermal cure or ultraviolet (UV) cure.

Figure 5B:
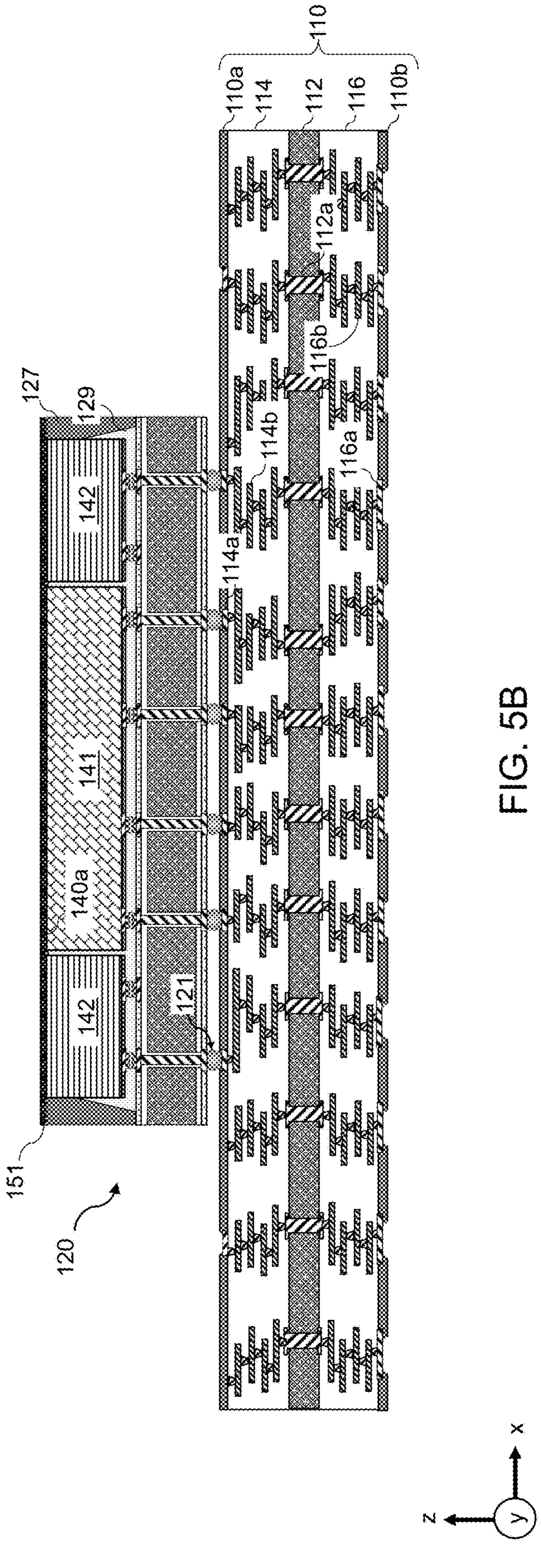
FIG. 5B illustrates a vertical cross-sectional view of an intermediate structure in which the interposer module may be mounted on the package substrate, according to one or more embodiments.

FIG. 5B illustrates a vertical cross-sectional view of an intermediate structure in which the interposer module 120 may be mounted on the package substrate 110, according to one or more embodiments. The interposer module 120 may be mounted on the package substrate 110, for example, by a flip chip bonding (FCB) process. The semiconductor die module 121 may be positioned over the package substrate 110, for example, by an electromechanical pick-and-place (PNP) machine. The C4 bumps 121 on the semiconductor die module 121 may then be lowered onto the package substrate upper bonding pads 114*a* of the package substrate 110 and heated in order to collapse the C4 bumps 121 and bond the C4 bumps 121 to the package substrate upper bonding pads 114*a*.

Figure 5C:
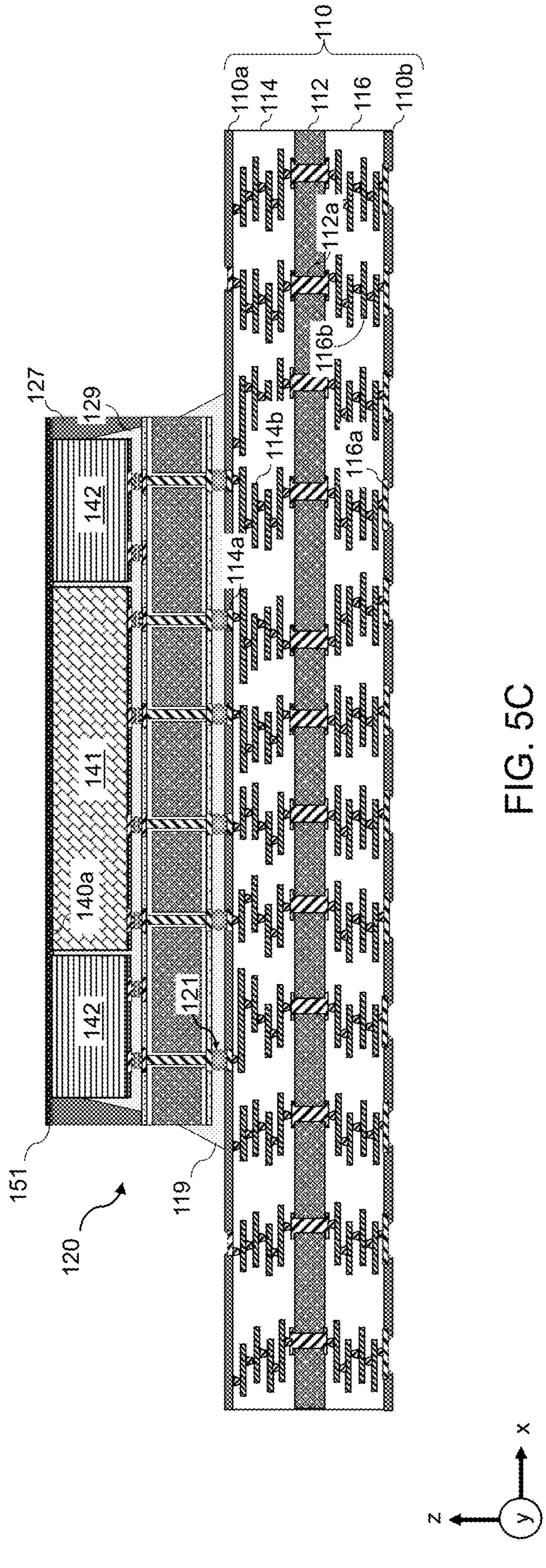
FIG. 5C illustrates a vertical cross-sectional view of an intermediate structure in which the package underfill layer may be formed on the package substrate according to one or more embodiments.

FIG. 5C illustrates a vertical cross-sectional view of an intermediate structure in which the package underfill layer 119 may be formed on the package substrate 110 according to one or more embodiments. The package underfill layer 119 may be formed of an epoxy-based polymeric material. As illustrated in FIG. 5C, the package underfill layer 119 may be formed (e.g., injected) under and around the interposer module 120 and the C4 bumps 121 to the package substrate 110. The package underfill layer 119 may then be cured, for example, in a box oven for duration in a range from 60 minutes to 120 minutes at a temperature in a range from 120° C. to 180° C. to provide the package underfill layer 119 with a sufficient stiffness and mechanical strength.

Figure 5D:
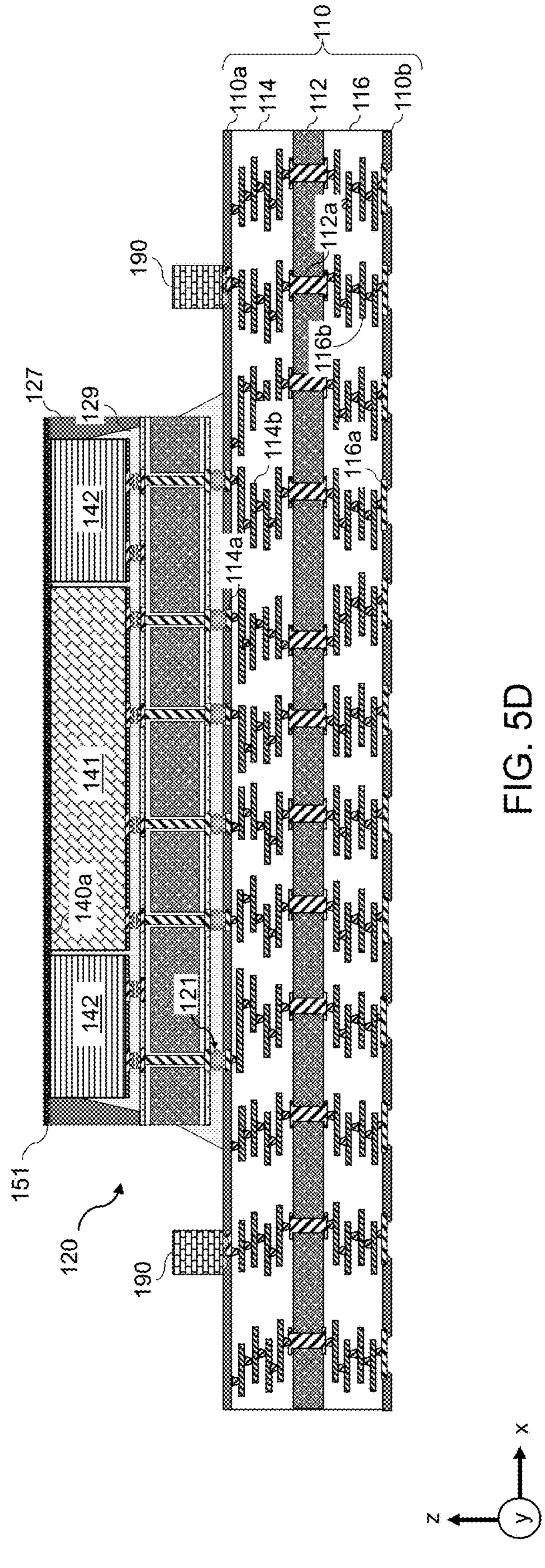
FIG. 5D illustrates a vertical cross-sectional view of an intermediate structure in which the SMDs may be mounted on the package substrate, according to one or more embodiments.

FIG. 5D illustrates a vertical cross-sectional view of an intermediate structure in which the SMDs 190 may be mounted on the package substrate 110, according to one or more embodiments. The SMDs 190 may then be positioned over the package substrate 110, for example, by an electromechanical pick-and-place (PNP) machine. The SMDs 190 (e.g., under the control of the PNP machine) may then be lowered onto the package substrate 110 and attached to package substrate 110. The SMDs 190 may be attached, for example, by bonding C4 bumps to package substrate upper bonding pads 114*a*, respectively. The SMDs 190 may alternatively or additionally be attached to the package substrate 110 by applying an adhesive (not shown) between the SMDs 190 and the package substrate 110. The adhesive may be substantially similar to the adhesive layer 160. The SMDs 190 may include bonding pads (not shown) that may be bonded to the package substrate upper bonding pads 114*a* of the package substrate 110. The SMDs 190 may thereby be electrically coupled to the package substrate 110.

Figure 5E:
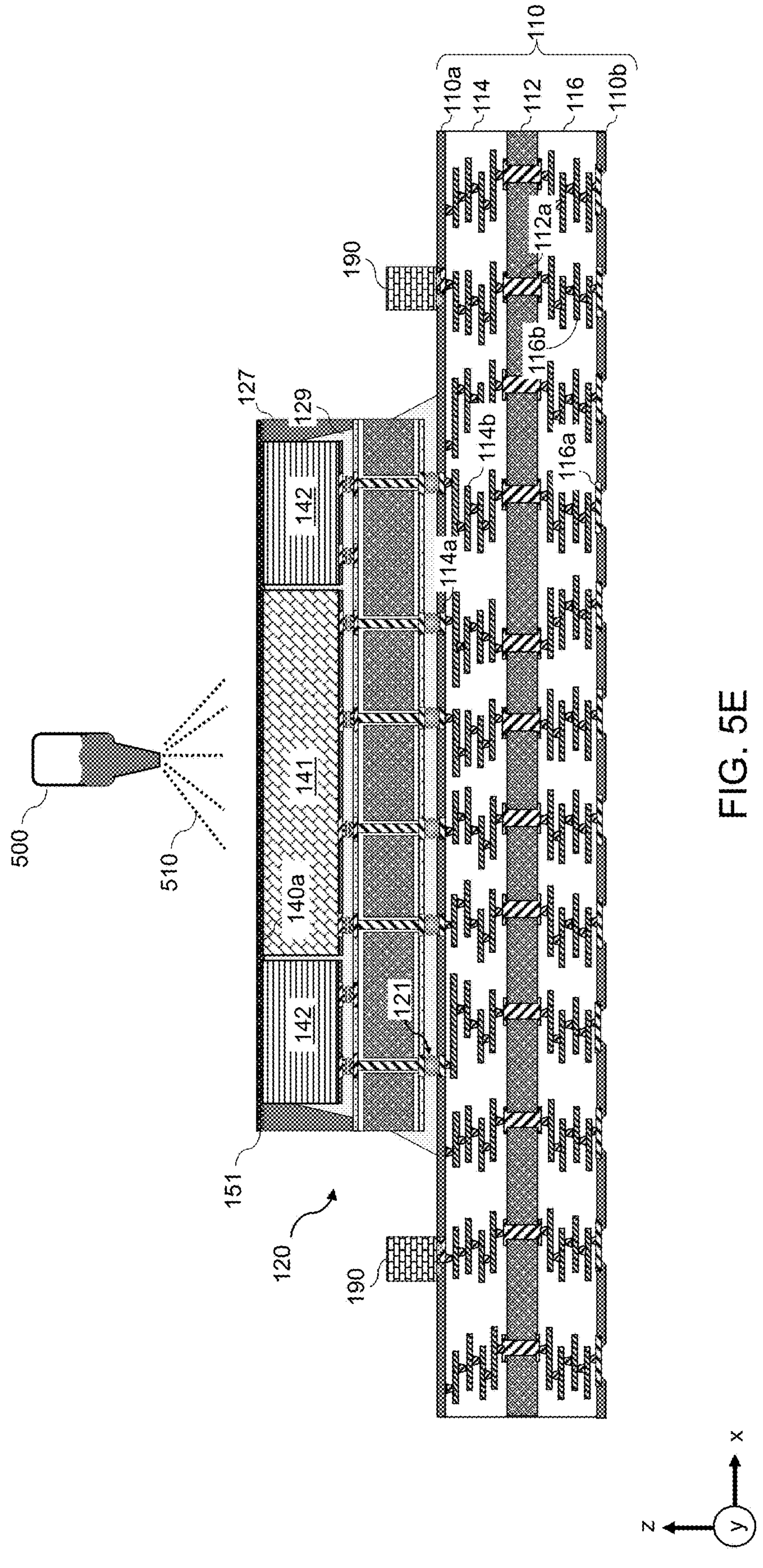
FIG. 5E illustrates a vertical cross-sectional view of an intermediate structure in a first flux jetting step, according to one or more embodiments.

FIG. 5E illustrates a vertical cross-sectional view of an intermediate structure in a first flux jetting step, according to one or more embodiments. In the first flux jetting step, a flux 510 may be applied to an upper surface of the interposer module 120. The flux 510 may be used to prepare the upper surface of the BSM layer 151. In particular, the flux 510 may be applied to the upper surface of the BSM layer 151 (if present) to help facilitate formation of a joint between the BSM layer 151 and the TIM layer 170 (e.g., a TIM layer including a metal such as indium or gallium).

The flux 510 may clean the upper surface of the BSM layer 151 and remove any impurities (e.g., oxides) which may inhibit formation of a perfect joint (e.g., solder joint). The flux 510 may also inhibit reoxidation of the upper surface of the BSM layer 151 during the soldering process, and reduce the surface tension and the viscosity of a metal (e.g., indium in the TIM layer 170). The flux 510 may include, for example, a rosin flux, organic acid flux or inorganic acid flux. Other suitable flux materials are within the contemplated scope of this disclosure. The flux may be applied, for example, as a liquid. As illustrated in FIG. 5E, a pressurized sprayer 500 may spray the flux 510 in a liquid state onto the upper surface of the BSM layer 151. In embodiments in which the optional BSM layer 151 is not present, the flux may also prepare and clean the upper surfaces of the dies 140 and the molding material layer 127.

Figure 5F:
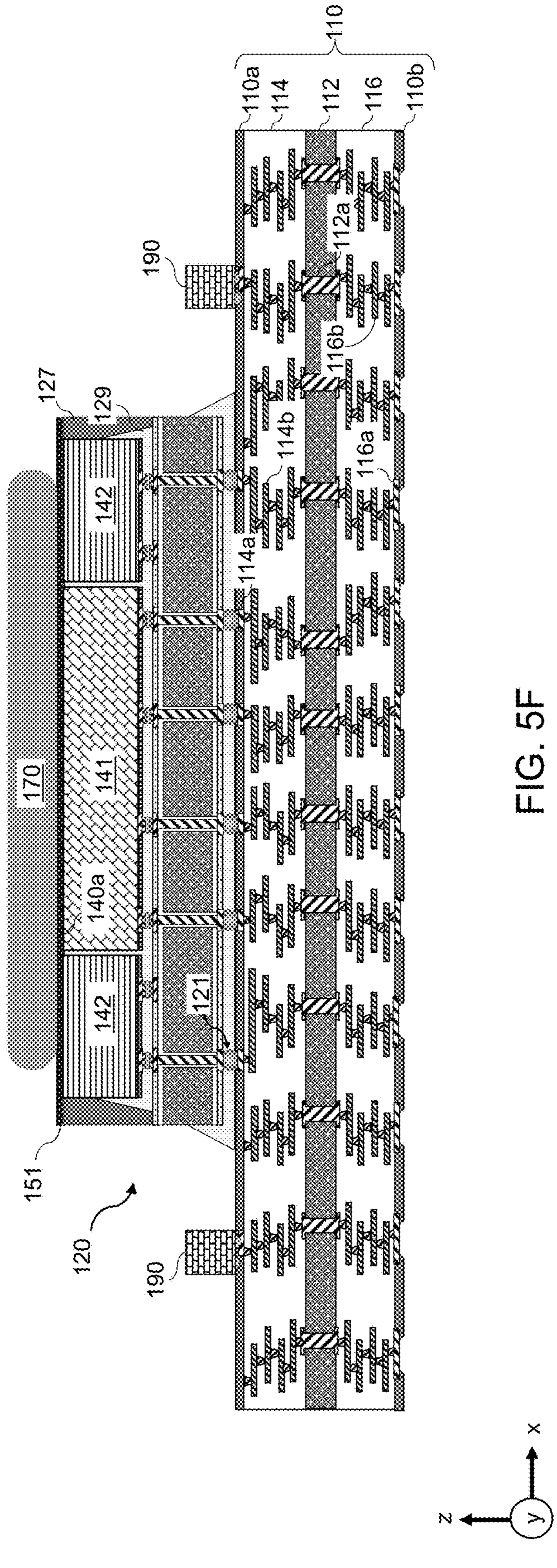
FIG. 5F illustrates a vertical cross-sectional view of an intermediate structure in which the TIM layer may be formed on (e.g., attached to) the interposer module according to one or more embodiments.

FIG. 5F illustrates a vertical cross-sectional view of an intermediate structure in which the TIM layer 170 may be formed on (e.g., attached to) the interposer module 120 according to one or more embodiments. As illustrated in FIG. 5F, the TIM layer 170 may be applied to have a width in the x-direction and length in the y-direction that are less than the completed width and length of the TIM layer 170, since the pressing of the fins 130*f* of the package lid 130 will cause a lateral displacement of the TIM layer 170 in the x-direction and y-direction.

In embodiments in which the TIM layer 170 includes a metal, then the TIM layer 170 may be applied onto the flux 510 (see FIG. 5E). The TIM layer 170 may be heated in which case the flux 510 may help to form a joint between the TIM layer 170 and the BSM layer 151.

In at least one embodiment, a thermally conductive adhesive may or may not be applied to the upper surface of the interposer module 120, depending upon the type of TIM layer 170 is being used. A material of the TIM layer 170 may be dispensed in the form of a liquid (e.g., grease, gel, paste, etc.) onto the upper surface of the interposer module 120 (or onto the thermally conductive adhesive if present). If the TIM layer 170 includes a solid material, the TIM layer 170 may be pressed onto the interposer module 120 or onto the adhesive if present.

Figure 5G:
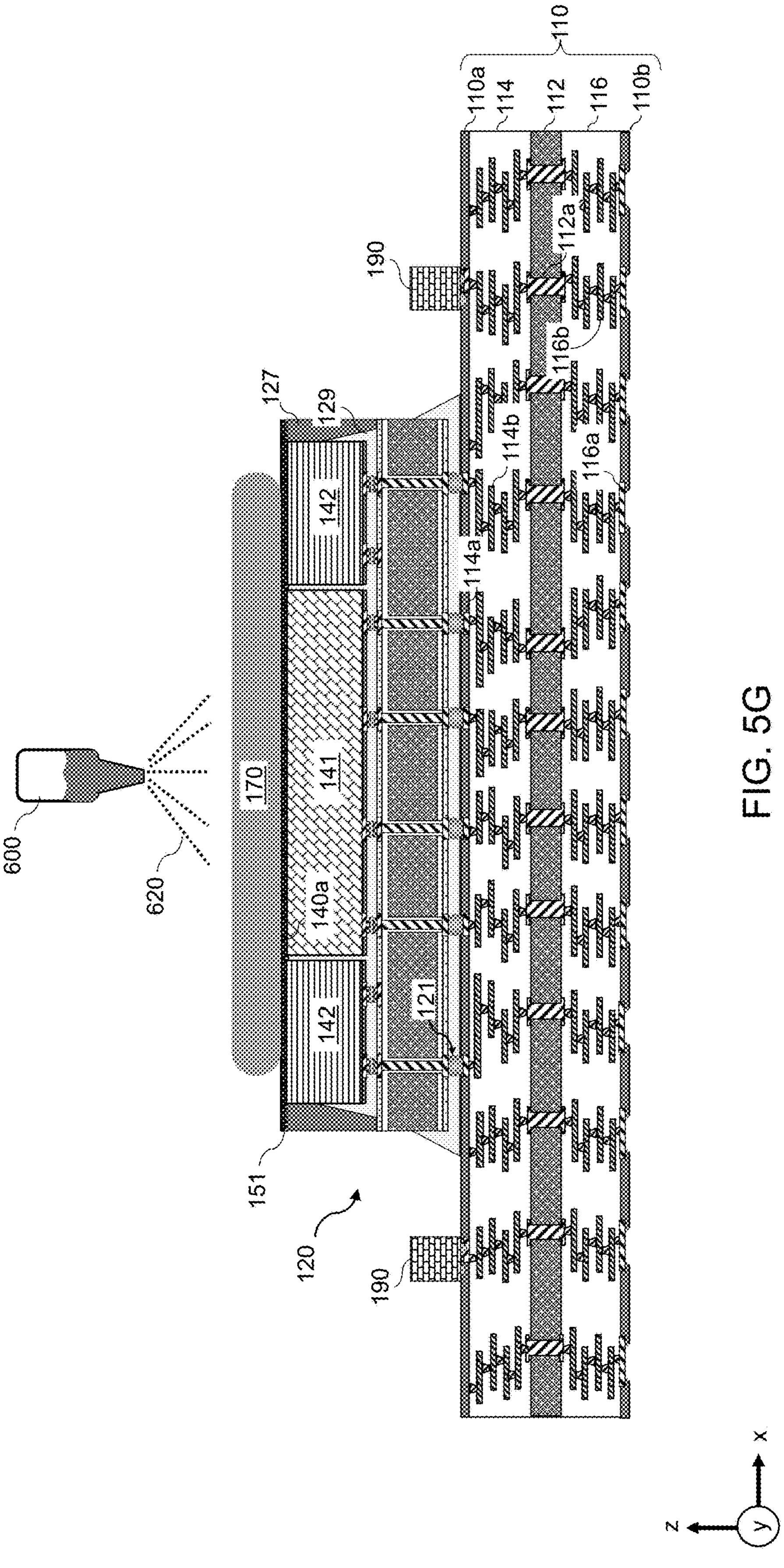
FIG. 5G illustrates a vertical cross-sectional view of an intermediate structure in a second flux jetting step, according to one or more embodiments.

FIG. 5G illustrates a vertical cross-sectional view of an intermediate structure in a second flux jetting step, according to one or more embodiments. In the second flux jetting step, a flux 620 may be applied to an upper surface of the TIM layer 170. The flux 620 may be substantially the same or different from the flux 510. The flux 510 may help to facilitate formation of a joint between the TIM layer 170 (e.g., a TIM layer including a metal such as indium or gallium) and the plating layer 130*m* of the package lid 130. The flux may be applied, for example, as a liquid. As illustrated in FIG. 5E, a pressurized sprayer 600 (e.g., which may be the same or different than the pressurized sprayer 500) may spray the flux 620 in a liquid state onto the upper surface of the TIM layer 170.

Figure 5H:
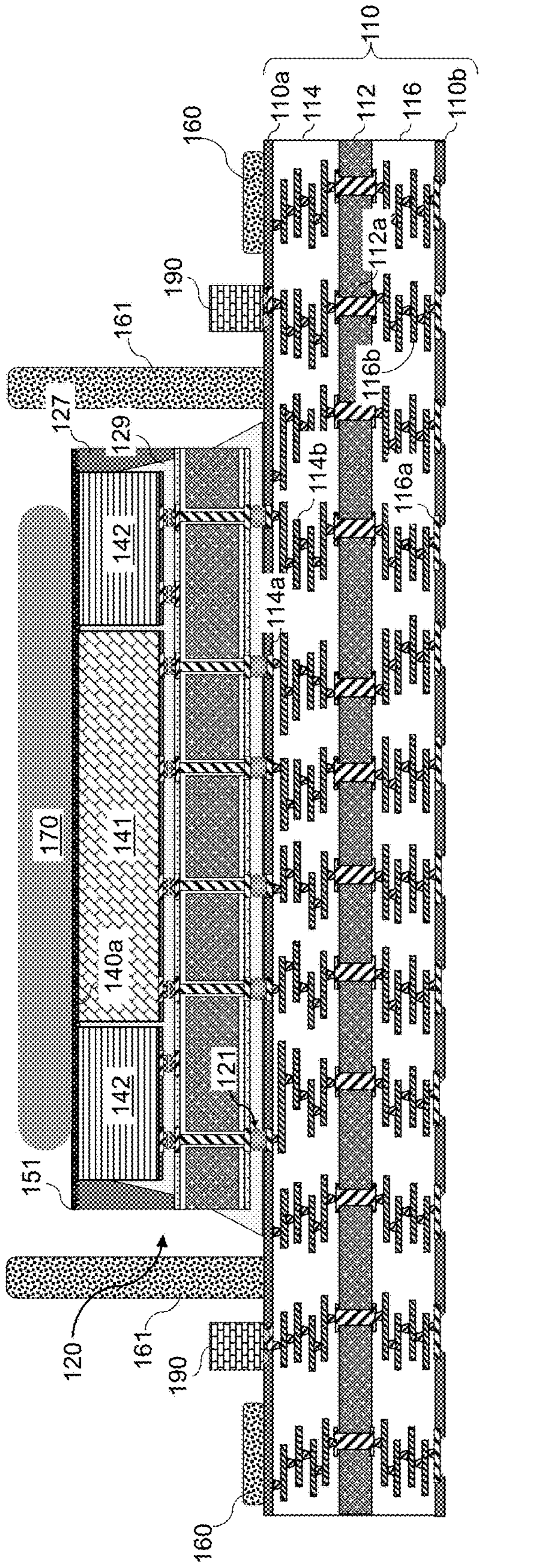
FIG. 5H illustrates a vertical cross-sectional view of an intermediate structure in which the adhesive layer and adhesive layer may be applied to the package substrate according to one or more embodiments.

FIG. 5H illustrates a vertical cross-sectional view of an intermediate structure in which the adhesive layer 160 and adhesive layer 161 may be applied to the package substrate 110 according to one or more embodiments. The adhesive layer 160 may be dispensed onto the package substrate 110 with a dispensing tool (e.g., automated dispensing tool). The dispensing tool may dispense the adhesive layer 160 in a frame shape around the interposer module 120. At the time of application, the adhesive layer 160 may be sufficiently rigid so as to form a semi-solid bead on the surface of the package substrate 110. In at least one embodiment, a viscosity of the adhesive layer 160 at the time of application may be 50,000 centipoise (cp) or greater. The shape of the semi-solid bead may remain substantially unchanged between the time of application by the dispensing tool and the later time of attaching the package lid 130. The location of the frame shape of the adhesive layer 160 may correspond to a location of the foot portion 130*a* of the package lid 130 (e.g., see FIG. 1B). A pressing of the package lid 130 onto the adhesive layer 160 may deform the adhesive layer 160.

The inner adhesive layer 161 may also be dispensed onto the package substrate 110 with a dispensing tool (e.g., automated dispensing tool). The inner adhesive layer 161 may be formed concurrently with the forming of the adhesive layer 160 in the same dispensing step and using the same dispensing tool. The inner adhesive layer 161 may alternatively be formed before or after the forming of the adhesive layer 160.

The dispensing tool may also dispense the inner adhesive layer 161 in a frame shape around the interposer module 120. At the time of application, the physical properties (e.g., viscosity) of the inner adhesive layer 161 may be substantially similar to the physical properties of the adhesive layer 160. The inner adhesive layer 161 may be applied with a thickness greater than the height of the upper surface of the TIM layer 170. A pressing of the package lid 130 onto the inner adhesive layer 161 may deform the inner adhesive layer 161 so that a height of an upper surface of the inner adhesive layer 161 may be substantially the same as the height of the upper surface of the TIM layer 170.

Figure 5I:
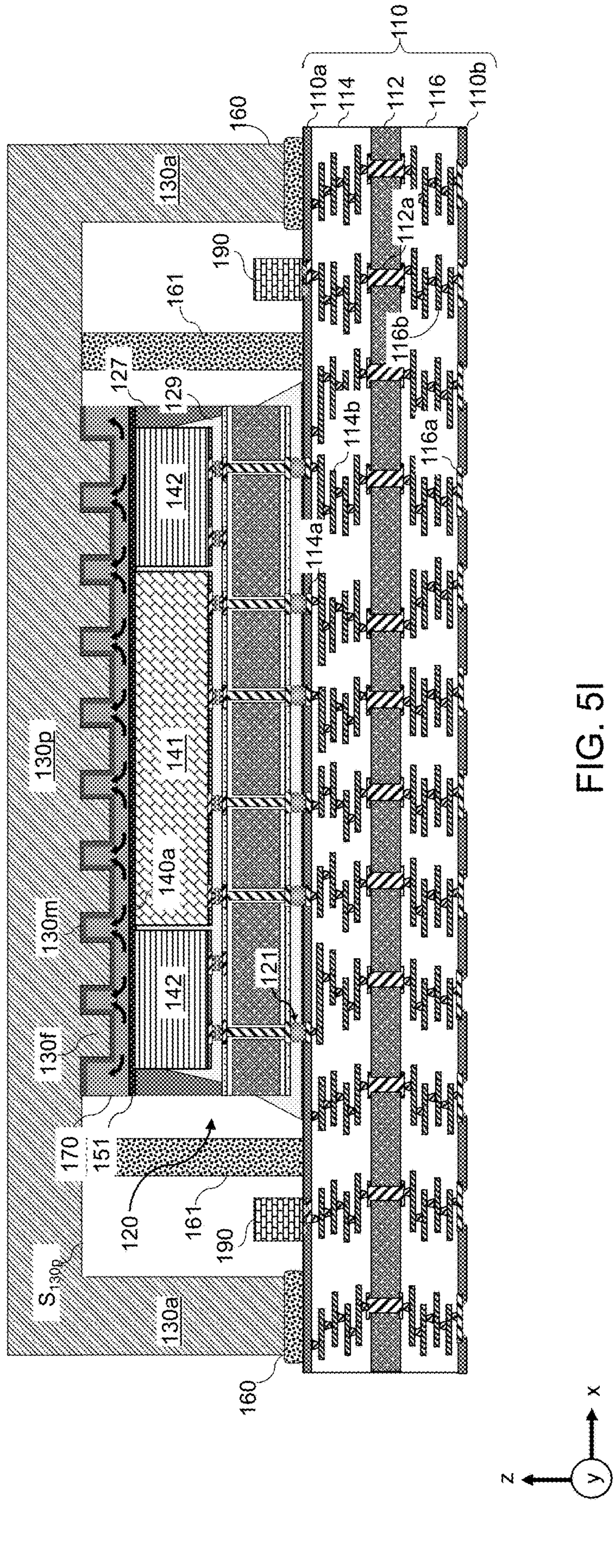
FIG. 5I illustrates a vertical cross-sectional view of an intermediate structure in which the package lid may be attached to (e.g., mounted on) the package substrate according to one or more embodiments.

FIG. 5I illustrates a vertical cross-sectional view of an intermediate structure in which the package lid 130 may be attached to (e.g., mounted on) the package substrate 110 according to one or more embodiments. After the fins 130*f* and the optional plating layer 130*m* have been formed on the package lid 130 (see FIGS. 3-41), the package lid 130 may be attached to the package substrate 110. In at least one embodiment, the package substrate 110 with the interposer module 120 may be placed on a surface. The package lid 130 may then be positioned over the package substrate 110, for example, by an electromechanical pick-and-place (PNP) machine. The package lid 130 may then be lowered down over the interposer module 120 and onto the package substrate 110. The foot portion 130*a* of the package lid 130 may then be aligned with the adhesive layer 160 formed on the package substrate 110. The package lid 130 may then be pressed downward on to the TIM layer 170 by applying a pressing force down onto the package lid 130 so that the foot portion 130*a* of the package lid 130 may be attached to the package substrate 110 through the adhesive layer 160.

By pressing the package lid 130 onto the TIM layer 170, the TIM layer 170 may be forced to flow (shown by directional arrows) into the gaps G between the fins 130*f* extending from the bottom surface S130*p*. The quantity (e.g., volume) of TIM layer 170 dispensed on the interposer module 120 may be sufficient to substantially fill the gaps G, while leaving adequate spacing between the package lid plate portion 130*p* and the interposer module 120.

The package lid 130 may then be clamped to the package substrate 110 for a period to allow the adhesive layer 160 and the inner adhesive layer 161 to cure and form a secure bond between the package substrate 110 and the package lid 130. The clamping of the package lid 130 to the package substrate 110 may be performed, for example, by using a heat clamp module. The heat clamp module may apply a uniform force across the upper surface of the package lid 130. In one or more embodiments, the heat clamp module may apply the pressing force to the package lid 130.

Figure 5J:
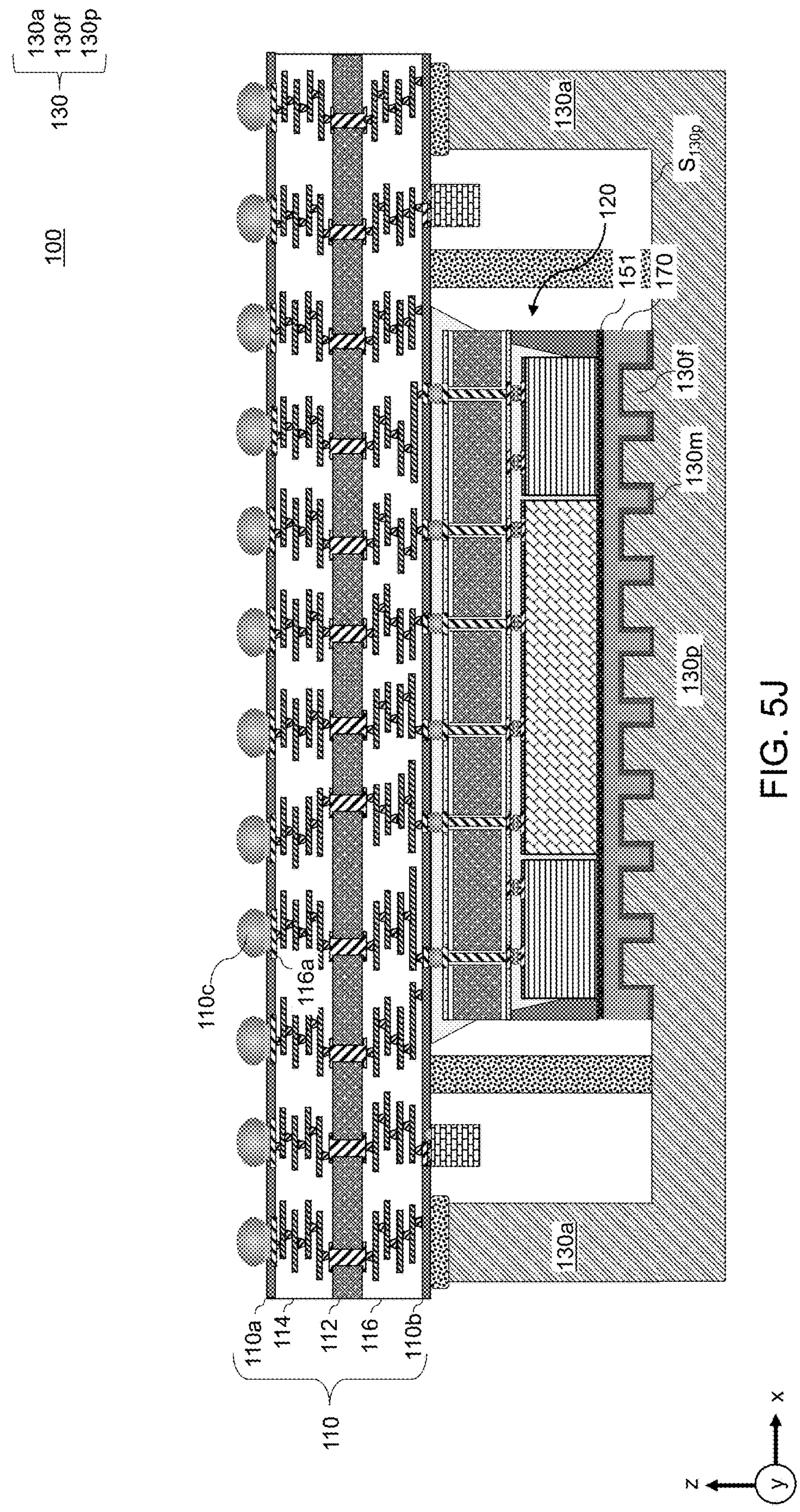
FIG. 5J illustrates a vertical cross-sectional view of an intermediate structure in which a plurality of solder balls may be formed on the package substrate according to one or more embodiments.

FIG. 5J illustrates a vertical cross-sectional view of an intermediate structure in which a plurality of solder balls 110*c* may be formed on the package substrate 110 according to one or more embodiments. The plurality of solder balls 110*c* may be formed on the package substrate lower bonding pads 116*a* through the openings O110*b* in the package substrate lower passivation layer 110*b* (see FIG. 5A). The solder balls 110*c* may be formed, for example, by an electroplating process. The solder balls 110*c* may be formed, for example, so as to be located under the foot portion 130*a* and under the interposer module 120 and therebetween. The plurality of solder balls 110*c* may constitute a ball-grid array (BGA) that may allow the package structure 100 to be securely mounted (e.g., by surface mount technology (SMT)) on a substrate such as a printed circuit board and electrically coupled to the substrate. Formation of the solder balls 110*c* may complete the formation of the package structure 100.

Figure 6:
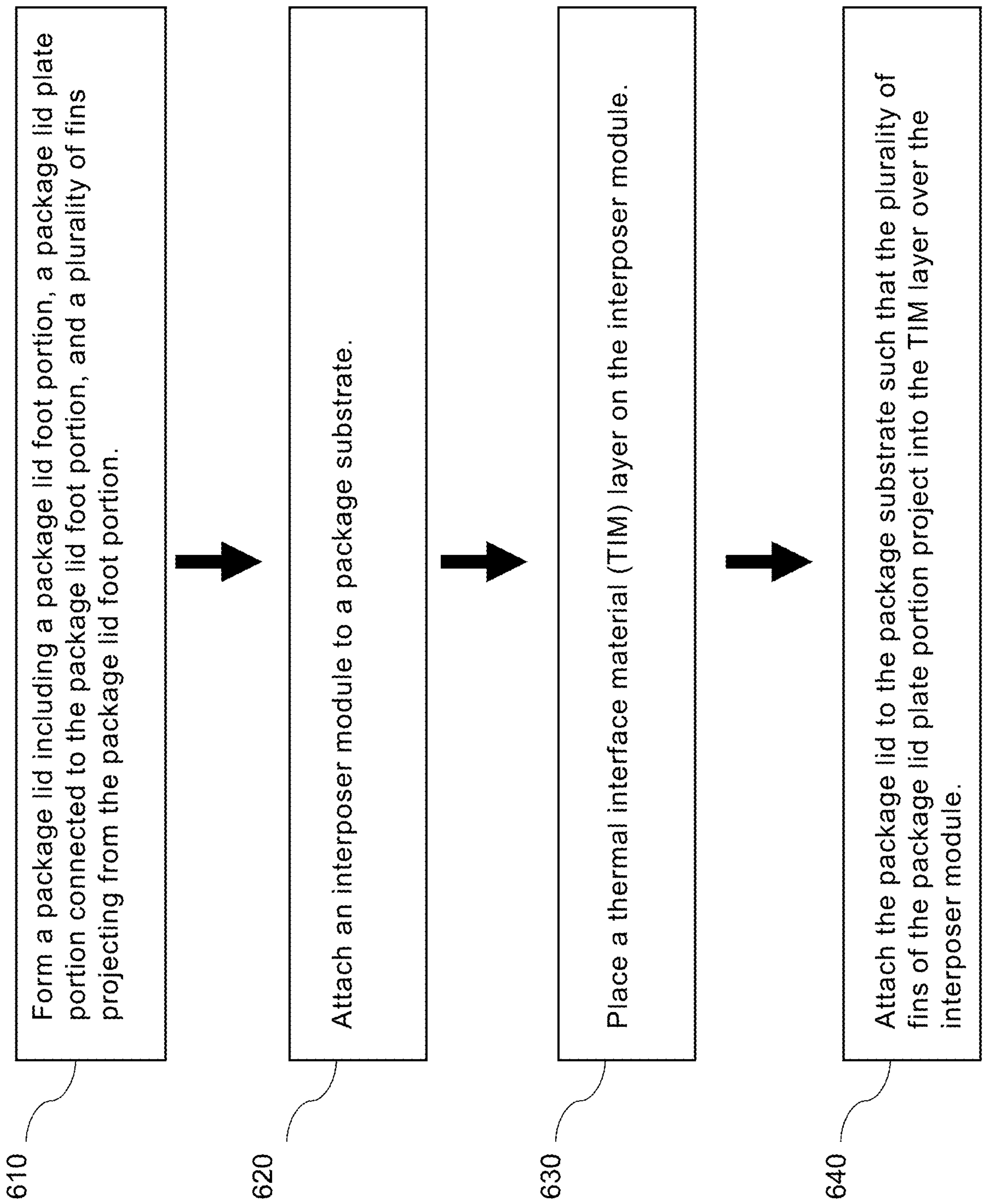
FIG. 6 is a flow chart illustrating a method of forming the package structure according to one or more embodiments.

FIG. 6 is a flow chart illustrating a method of forming the package structure 100 according to one or more embodiments. Step 610 includes forming a package lid including a package lid foot portion, a package lid plate portion connected to the package lid foot portion, and a plurality of fins extending from the package lid foot portion. Step 620 includes attaching an interposer module to a package substrate. Step 630 includes placing a thermal interface material (TIM) layer on the interposer module. Step 640 includes attaching the package lid to the package substrate such that the plurality of fins of the package lid plate portion extend into the TIM layer over the interposer module.

The method illustrated in FIG. 6 is not intended to limit the method to a specific sequence of steps. For example, the formation of the package lid in step 610 may occur at any time prior to attaching the package lid 130 to the package substrate 110. The formation of the package lid in step 610 does not necessarily occur prior to the attaching of the interposer module 120 to the package substrate 110 and/or the placement of TIM layer 170 on the interposer module 120.

Figure 7A:
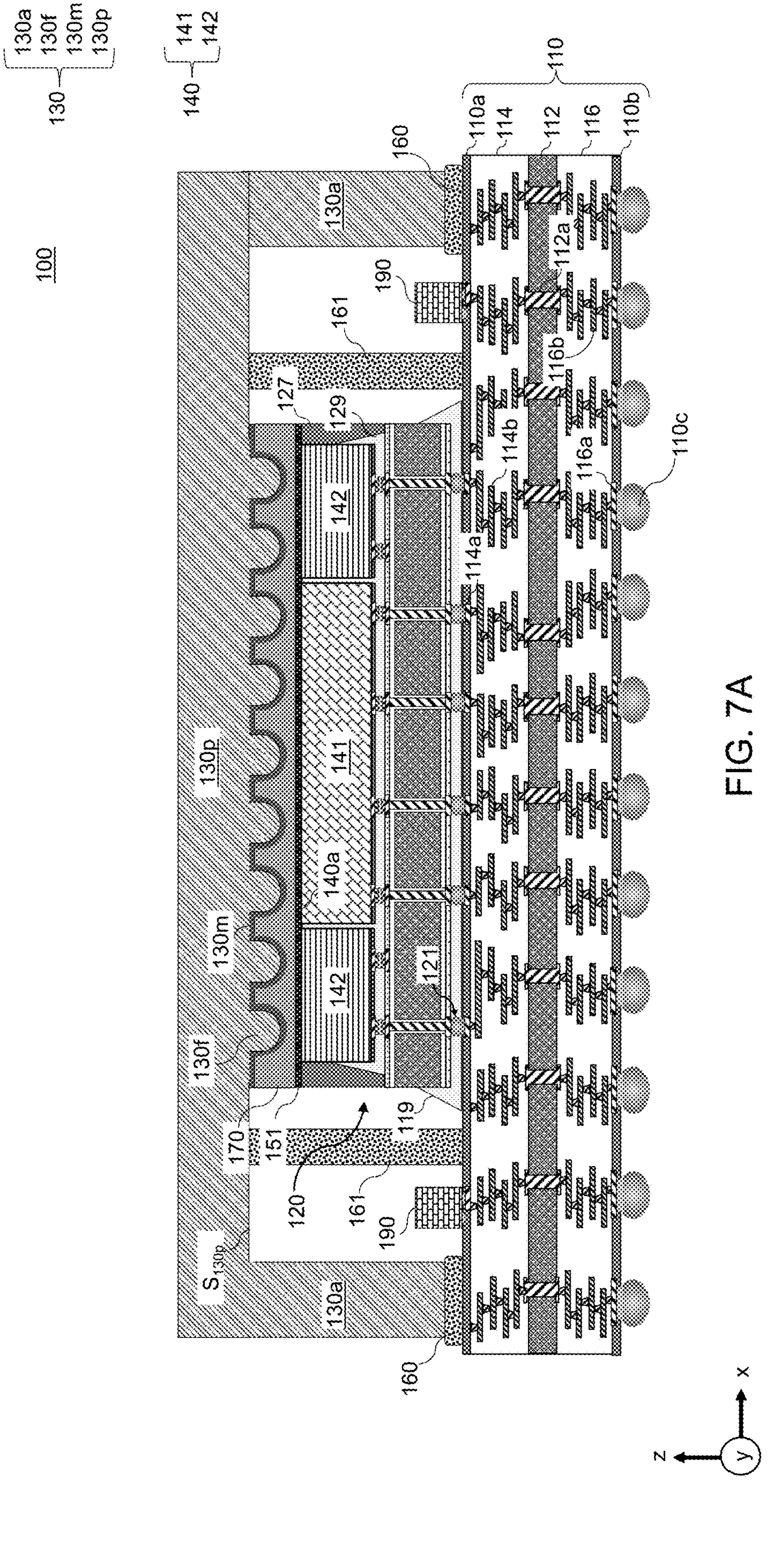
FIG. 7A is a vertical cross-sectional view of the package structure having a first alternative design, according to one or more embodiments.

FIG. 7A is a vertical cross-sectional view of the package structure 100 having a first alternative design, according to one or more embodiments. As illustrated in FIG. 7, in the first alternative design, the fins 130*f* may have a rounded shape. In particular, the fins 130*f* may have an arc-shaped end portion that extends into (e.g., is embedded in) the TIM layer 170. The width, thickness and pitch of the fins 130*f* in the first alternative design may be substantially the same as the width $W_{130f}$, thickness $T_{130f}$ and pitch $P_{130f}$ of the fins 130*f* in the original design (see FIGS. 1A-1C). The fins 130*f* in the first alternative design may be formed in substantially the same manner as the fins 130*f* in the original design (see FIGS. 2A-3E).

Figure 7B:
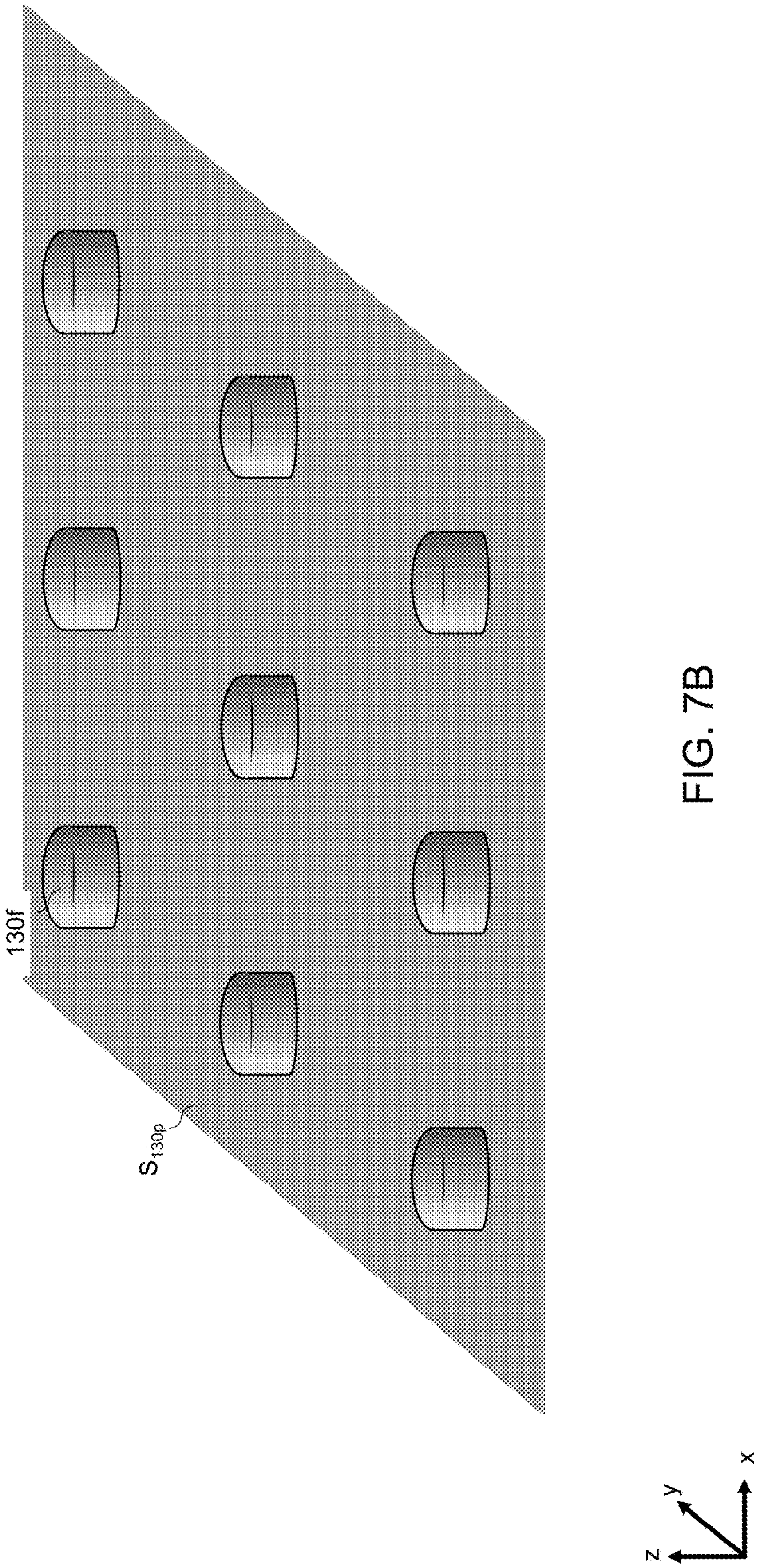
FIG. 7B is a perspective view of a portion of the fins in the package structure having the first alternative design, according to one or more embodiments.

FIG. 7B is a perspective view of a portion of the fins 130*f* in the package structure 100 having the first alternative design, according to one or more embodiments. As illustrated in FIG. 7B, the fins 130*f* in the first alternative design may have a circular cylindrical shape extending from the bottom surface S130*p* of the package lid plate portion 130*p*. The arc-shaped end portion of the fins 130*f* may include a semispherical shape located at the distal end of the circular cylindrical shape.

Figure 7C:
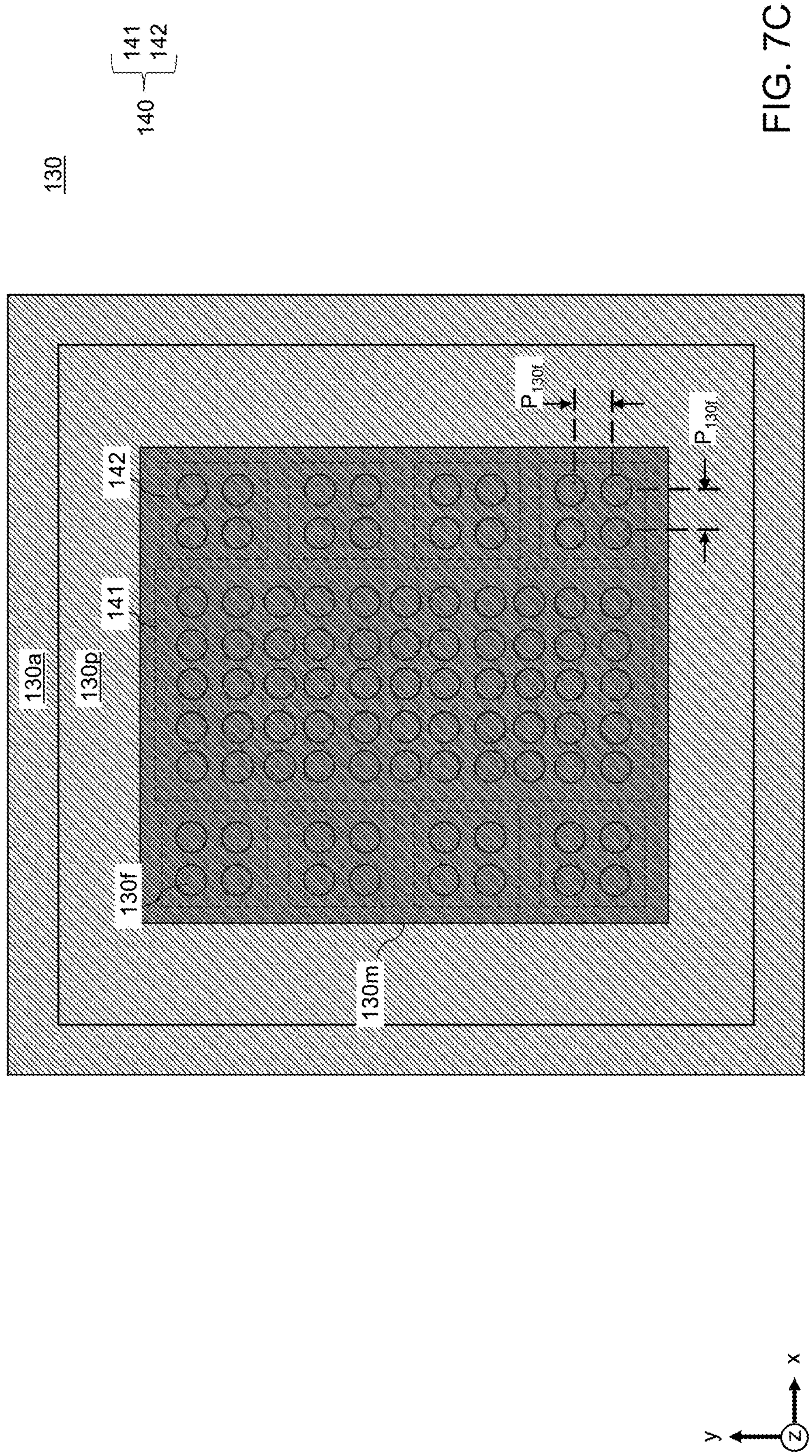
FIG. 7C illustrates the bottom surface of the package lid of the package structure having the first alternative design according to one or more embodiments.

FIG. 7C illustrates the bottom surface of the package lid 130 of the package structure 100 having the first alternative design according to one or more embodiments. As illustrated in FIG. 7C, in the first alternative design, the fins 130*f* may have a circular cross-section. The layout of the fins 130*f* in the first alternative design may be substantially similar to the layout of the fins 130*f* in the original design (see FIG. 4). The pitch of the fins 130*f* in the first alternative design may be substantially the same as the pitch P130*f* of the fins 130*f* in the original design (see FIGS. 1A-1C). The optional plating layer 130*m* may be formed on the fins 130*f*. The optional plating layer 130*m* may have a size and shape substantially similar to the size and shape of the optional plating layer 130*m* in the original design.

Figure 8:
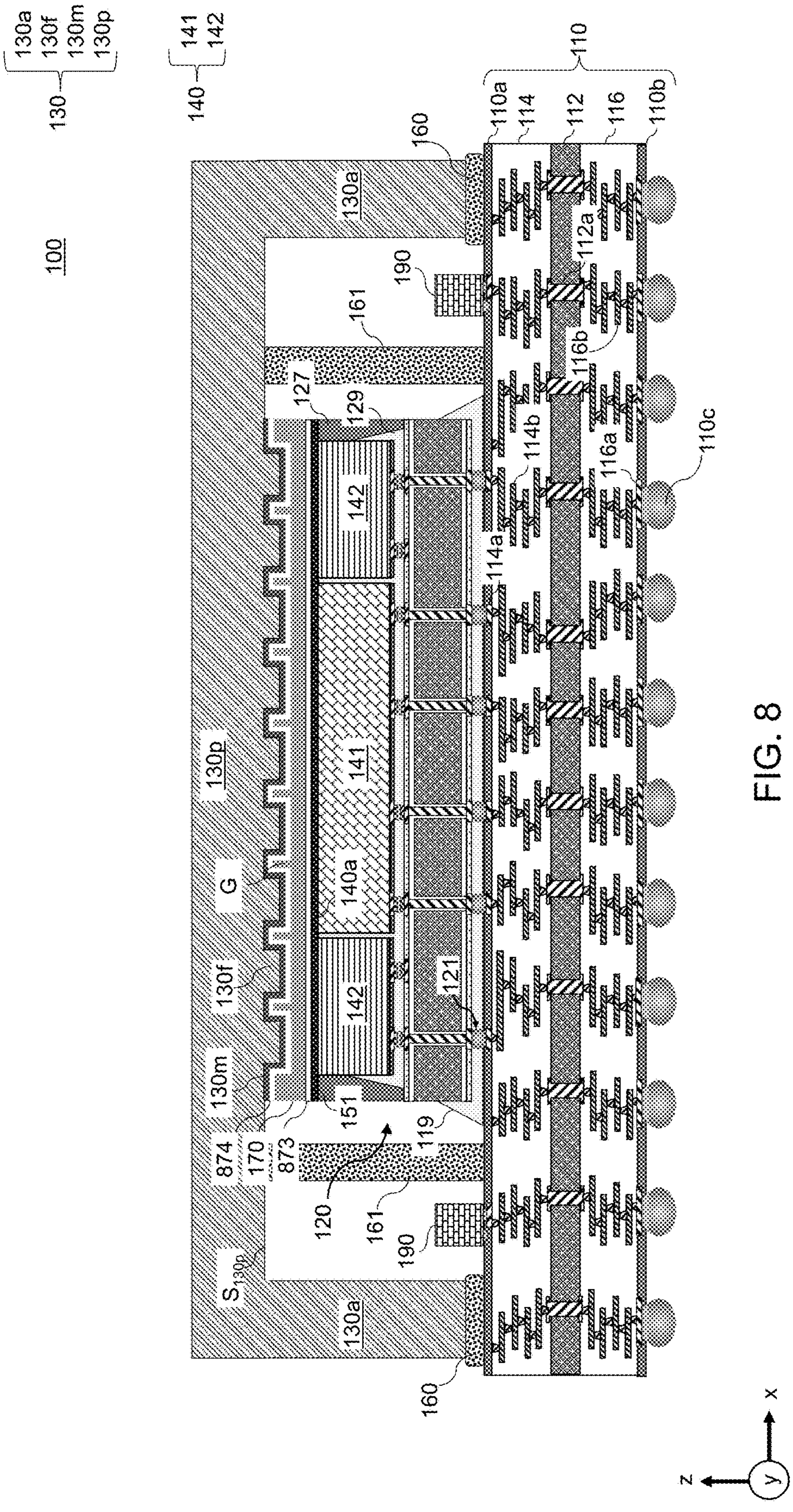
FIG. 8 is a vertical cross-sectional view of the package structure having a second alternative design, according to one or more embodiments.

FIG. 8 is a vertical cross-sectional view of the package structure 100 having a second alternative design, according to one or more embodiments. The second alternative design in FIG. 8 may be substantially similar to the original design (see FIGS. 1A-1C). However, the second alternative design of the package structure 100 may include a first intermetallic compound (IMC) layer 873 in a jointed interface of the TIM layer 170 and the BSM layer 151 (e.g., indium/BSM interface). The second alternative design of the package structure 100 may also include a second IMC layer 874 in a jointed interface of the TIM layer 170 and the package lid plate portion 130*p* (e.g., indium/plating layer interface). A thickness of each of the first IMC layer 873 and second IMC layer 874 may be in a range from about 0.5 μm to about 2.0 μm (e.g., about 1.0 μm). Each of the first IMC layer 873 and second IMC layer 874 may include, for example, Au—In, Ni—In, Ni—Au—In, etc.

Referring now to FIGS. 1A-8, a package structure 100 may include a package substrate 110, an interposer module 120 on the package substrate 110, a thermal interface material (TIM) layer 170 on the interposer module 120, and a package lid 130 on the TIM layer 170. The package lid 130 may include a package lid foot portion 130*a* attached to the package substrate 110, a package lid plate portion 130*p* connected to the package lid foot portion 130*a*, and a plurality of fins 130*f* extending from the package lid plate portion 130*p* into the TIM layer 170 over the interposer module 120.

In one embodiment, the TIM layer 170 may include a low-melting-temperature metal. In one embodiment, the low-melting-temperature metal may include at least one of indium, gallium, silver or tin. In one embodiment, the package lid plate portion 130*p* may include a bottom surface S130*p* adjoining the package lid foot portion 130*a* and the plurality of fins 130*f* extend from the bottom surface S130*p*. In one embodiment, the TIM layer 170 contacts the bottom surface S130*p* of the package lid plate portion 130*p* in a gap G between the plurality of fins 130*f*. In one embodiment, the TIM layer 170 may have a first thickness T1170 between the bottom surface S130*p* of the package lid plate portion 130*p* and the interposer module 120 and a second thickness T2170 less than the first thickness T1170 between the plurality of fins 130*f* and the interposer module 120. In one embodiment, a thickness T130*f* of the plurality of fins 130*f* may be in a range from 25 μm to 100 μm. A pitch P130*f* of the plurality of fins 130*f* may be in a range from 1 mm to 5 mm. In one embodiment, a width W130*f* of the plurality of fins 130*f* may be in a range from 100 μm to 1000 μm. In one embodiment, the plurality of fins 130*f* may include a square cylindrical shape and a square-shaped end portion of the plurality of fins 130*f* may be embedded in the TIM layer 170. In one embodiment, the interposer module 120 may include a backside metal (BSM) layer 151 and the TIM layer 170 may be on the BSM layer 151. In one embodiment, the package lid 130 may include a plating layer 130*m* on the plurality of fins 130*f* and on the bottom surface S130*p* of the package lid plate portion 130*p* and the plating layer 130*m* contacts an upper surface of the TIM layer 170. In one embodiment, the package structure 100 may further include a first intermetallic compound (IMC) layer 873 between the TIM layer 170 and the BSM layer 151, and a second IMC layer 874 between the package lid plate portion 130*p* and the TIM layer 170. In one embodiment, the first IMC layer 873 and the second IMC layer 874 may have a thickness in a range from 0.5 μm to 2.0 μm.

Referring again to FIGS. 1A-8, a method of forming a package structure 100 may include forming a package lid 130 including a package lid foot portion 130*a*, a package lid plate portion 130*p* connected to the package lid foot portion 130*a*, and a plurality of fins 130*f* extending from the package lid foot portion 130*a*, attaching an interposer module 120 to a package substrate 110, placing a thermal interface material (TIM) layer 170 on the interposer module 120, and attaching the package lid 130 to the package substrate 110 such that the plurality of fins 130*f* of the package lid plate portion 130*p* extend into the TIM layer 170 over the interposer module 120. In one embodiment, the forming of the package lid 130 may include forming the plurality of fins 130*f* to have a thickness in a range from 25 μm to 100 μm, a pitch in a range from 1 mm to 5 mm, and a width in a range from 100 μm to 1000 μm. In one embodiment, the forming of the package lid 130 may include forming the plurality of fins 130*f* to include a circular cylindrical shape having an arc-shaped end portion, and the attaching of the package lid 130 to the package substrate 110 may include embedding the arc-shaped end portion in the TIM layer 170. In one embodiment, the interposer module 120 may include a backside metal (BSM) layer 151 and the placing of the TIM layer 170 on the interposer module 120 may include placing the TIM layer 170 on the BSM layer 151 of the interposer module 120. In one embodiment, the package lid 130 may include a plating layer 130*m* on the plurality of fins 130*f* and on the bottom surface S130*p* of the package lid plate portion 130*p* and the attaching of the package lid 130 to the package substrate 110 may include contacting the plating layer 130*m* to an upper surface of the TIM layer 170.

Referring again to FIGS. 1A-8 and in particular, FIGS. 7A-7C, a package structure 100 may include a package substrate 110, an interposer module 120 including a plurality of semiconductor dies on the package substrate 110, a metallic thermal interface material (TIM) layer 170 on the interposer module 120 and a package lid 130 on the metallic TIM layer 170.

In at least one embodiment, the package lid 130 may include a package lid foot portion 130*a* attached to the package substrate 110, a package lid plate portion 130*p* over the interposer module 120 and connected to the package lid foot portion 130*a*, and a plurality of fins 130*f* extending from the package lid plate portion 130*p* into the metallic TIM layer 170 over the plurality of semiconductor dies of the interposer module, wherein the plurality of fins 130*f* may include a circular cylindrical shape and an arc-shaped end portion of the plurality of fins 130*f* may be embedded in the metallic TIM layer 170.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a package substrate;

an interposer module on the package substrate, wherein the interposer module comprises a backside metal (BSM) layer;

a thermal interface material (TIM) layer on the BSM layer of the interposer module; and a package lid on the TIM layer, comprising:

a package lid foot portion attached to the package substrate;

a package lid plate portion connected to the package lid foot portion; and a plurality of fins extending from the package lid plate portion into the TIM layer over the interposer module.

2. The package structure of claim 1, wherein the TIM layer comprises a metal comprising at least one of indium, gallium, silver, or tin.

3. The package structure of claim 1, wherein the package lid plate portion comprises a bottom surface adjoining the package lid foot portion, and the plurality of fins extend from the bottom surface.

4. The package structure of claim 3, wherein the TIM layer contacts the bottom surface of the package lid plate portion in a gap between the plurality of fins.

5. The package structure of claim 1, wherein the TIM layer has a first thickness between a bottom surface of the package lid plate portion and the interposer module and a second thickness less than the first thickness between the plurality of fins and the interposer module.

6. The package structure of claim 1, wherein a thickness of the plurality of fins is in a range from 25 μm to 100 μm.

7. The package structure of claim 1, wherein a pitch of the plurality of fins is in a range from 1 mm to 5 mm.

8. The package structure of claim 1, wherein a width of the plurality of fins is in a range from 100 μm to 1000 μm.

9. The package structure of claim 1, wherein the plurality of fins comprises a square cylindrical shape and a square-shaped end portion of the plurality of fins is embedded in the TIM layer.

10. The package structure of claim 1, wherein the package lid further comprises a plating layer on the plurality of fins and on a bottom surface of the package lid plate portion and the plating layer contacts an upper surface of the TIM layer.

11. The package structure of claim 10, further comprising:
a first intermetallic compound (IMC) layer between the TIM layer and the BSM layer; and
a second IMC layer between the package lid plate portion and the TIM layer.

12. The package structure of claim 11, wherein the first IMC layer and the second IMC layer have a thickness in a range from 0.5 μm to 2.0 μm.

13. A method of forming a package structure, comprising:
forming a package lid comprising a package lid foot portion, a package lid plate portion connected to the package lid foot portion, and a plurality of fins extending from the package lid plate portion;
attaching an interposer module to a package substrate, wherein the interposer module comprises a backside metal (BSM) layer;
placing a thermal interface material (TIM) layer on the BSM layer of the interposer module; and
attaching the package lid to the package substrate such that the plurality of fins of the package lid plate portion extend into the TIM layer over the interposer module.

14. The method of claim 13, wherein the forming of the package lid comprises forming the plurality of fins to have a thickness in a range from 25 μm to 100 μm, a pitch in a range from 1 mm to 5 mm, and a width in a range from 100 μm to 1000 μm.

15. The method of claim 13, wherein the forming of the package lid comprises forming the plurality of fins to include a circular cylindrical shape having an arc-shaped end portion, and the attaching of the package lid to the package substrate comprises embedding the arc-shaped end portion in the TIM layer.

16. The method of claim 13, wherein the package lid further comprises a plating layer on the plurality of fins and on a bottom surface of the package lid plate portion and the attaching of the package lid to the package substrate comprises contacting the plating layer to an upper surface of the TIM layer.

17. A package structure, comprising:
a package substrate;
an interposer module including a plurality of semiconductor dies on the package substrate;
a metallic thermal interface material (TIM) layer on the interposer module; and
a package lid on the metallic TIM layer, comprising:
a package lid foot portion attached to the package substrate;
a package lid plate portion over the interposer module and connected to the package lid foot portion;
a plurality of fins extending from the package lid plate portion into the metallic TIM layer over the plurality of semiconductor dies of the interposer module, wherein the plurality of fins comprises a circular cylindrical shape and an arc-shaped end portion of the plurality of fins is embedded in the metallic TIM layer; and
a plating layer on the plurality of fins and on a bottom surface of the package lid plate portion, wherein the plating layer contacts an upper surface of the metallic TIM layer.

18. The package structure of claim 1, wherein the package lid comprises a surface composition, from inside to outside, that includes copper, nickel, and gold or silver.

19. The package structure of claim 1, wherein the plurality of fins extend into the TIM layer over a molding material layer of the interposer module.

20. The method of claim 13, wherein the forming of the package lid comprises forming the plurality of fins by a stamping process.

* * * * *